United States Patent
Wig et al.

(10) Patent No.: US 10,999,924 B2
(45) Date of Patent: *May 4, 2021

(54) SIDEBAND CONDUCTOR RESONANCE MITIGATION

(71) Applicant: Intel Corporation, Santa Clara, CA (US)

(72) Inventors: Timothy D. Wig, Northborough, MA (US); Steven K. Krooswyk, Cayce, SC (US); Marc Wells, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/723,784

(22) Filed: Dec. 20, 2019

(65) Prior Publication Data

US 2020/0275549 A1   Aug. 27, 2020

Related U.S. Application Data

(63) Continuation of application No. 15/979,268, filed on May 14, 2018, now Pat. No. 10,602,607, which is a continuation of application No. 15/079,890, filed on Mar. 24, 2016, now Pat. No. 9,974,161.

(60) Provisional application No. 62/184,830, filed on Jun. 25, 2015.

(51) Int. Cl.
  *H05K 1/02*   (2006.01)
  *H05K 1/11*   (2006.01)
  *H01L 23/66*  (2006.01)

(52) U.S. Cl.
  CPC ......... *H05K 1/0251* (2013.01); *H05K 1/0218* (2013.01); *H05K 1/0219* (2013.01);
  (Continued)

(58) Field of Classification Search
  CPC ...... H05K 1/025; H05K 1/117; H05K 1/0219; H05K 1/0218; H05K 1/0234;
  (Continued)

(56) References Cited

U.S. PATENT DOCUMENTS

| 5,747,893 A  | 5/1998 | Bennett et al. |
| 6,583,598 B2 | 6/2003 | Raith et al. |

(Continued)

FOREIGN PATENT DOCUMENTS

| CN | 202261038 U   | 5/2012  |
| WO | 2016209448 A1 | 12/2016 |

OTHER PUBLICATIONS

International Preliminary Report on Patentability for Application No. PCT/US2016/033690, dated Jan. 4, 2018, 12 Pages.

(Continued)

*Primary Examiner* — Robert J Pascal
*Assistant Examiner* — Kimberly E Glenn
(74) *Attorney, Agent, or Firm* — Alliance IP, LLC

(57) ABSTRACT

An apparatus comprising includes a first pair of conductors to carry differential signals, at least one ground conductor neighboring the first pair of conductors, the ground conductor to be connected to a ground plane, and at least one particular conductor to carry sideband signals. The particular conductor is to be connected to a ground plane via a resonance mitigation circuit, and the resonance mitigation circuit comprises a resistor.

23 Claims, 19 Drawing Sheets

(52) U.S. Cl.
CPC ............... *H05K 1/117* (2013.01); *H01L 23/66* (2013.01); *H05K 1/0231* (2013.01); *H05K 1/0233* (2013.01); *H05K 1/0234* (2013.01); *H05K 1/0245* (2013.01); *H05K 2201/10015* (2013.01); *H05K 2201/10022* (2013.01)

(58) Field of Classification Search
CPC ............... H05K 1/0233; H05K 1/0245; H05K 2201/10022; H05K 2201/10015; H01L 23/66
USPC .......................................................... 333/12
See application file for complete search history.

(56) References Cited

U.S. PATENT DOCUMENTS

| | | | |
|---|---|---|---|
| 10,602,607 B2* | 3/2020 | Wig | ............... H05K 1/0251 |
| 2004/0066246 A1 | 4/2004 | Cherniski et al. | |
| 2005/0013145 A1 | 1/2005 | Huber | |
| 2013/0132746 A1 | 5/2013 | Chen et al. | |
| 2014/0049343 A1 | 2/2014 | Sakai | |
| 2014/0141654 A1 | 5/2014 | Wig et al. | |
| 2014/0357105 A1 | 12/2014 | Wig | |
| 2018/0262000 A1 | 9/2018 | Golubovic et al. | |

OTHER PUBLICATIONS

International Search Report and Written Opinion for Application No. PCT/US2016/033690 dated Aug. 8, 2016, 13 pages.

SIPO; First Office Action issued in Chinese Patent Application No. 201680030140.0, dated Nov. 28, 2019; 13 pages without English translation.

SIPO; Second Office Action issued in Chinese Patent Application No. 201680030140.0, dated Aug. 3, 2020; 20 pages including English translation.

* cited by examiner

600

630 632 620  622 640 642 610 612 650 652

SIDEBAND CONDUCTOR RESONANCE MITIGATION

This application is a continuation (and claims the benefit of priority under 35 U.S.C. § 120) of U.S. application Ser. No. 15/979,268, filed May 14, 2018, and entitled SIDEBAND CONDUCTOR RESONANCE MITIGATION, which is a continuation (and claims the benefit of priority under 35 U.S.C. § 120) of U.S. application Ser. No. 15/079,890, filed Mar. 24, 2016, and entitled SIDEBAND CONDUCTOR RESONANCE MITIGATION, which claims benefit to U.S. Provisional patent application Ser. No. 62/184,830, filed Jun. 25, 2015 and incorporated by reference herein in its entirety.

FIELD

This disclosure pertains to computing system, and in particular (but not exclusively) connections to facilitate electronic communication.

DETAILED DESCRIPTION

Figure 1:
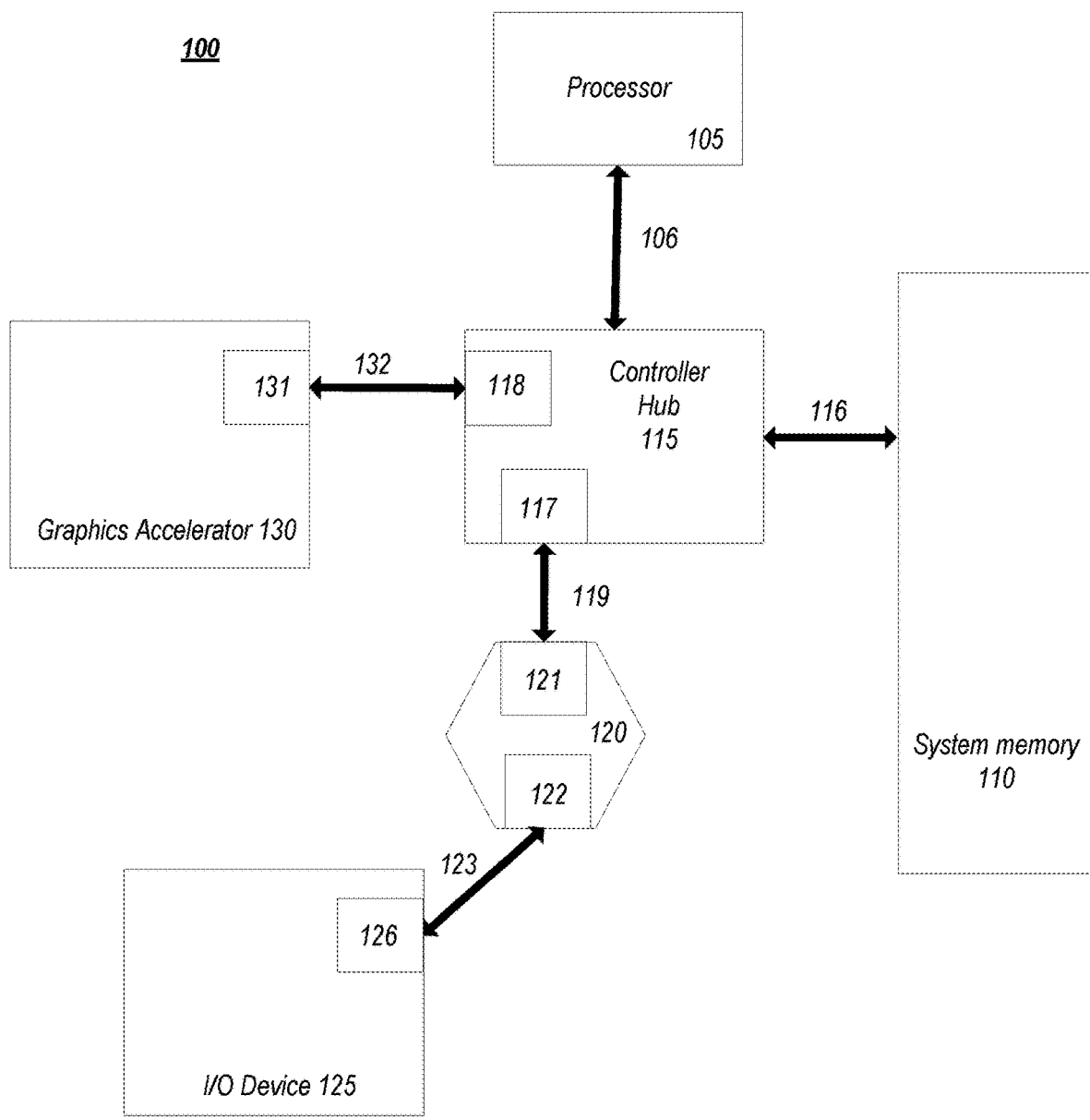
FIG. 1 illustrates an embodiment of a computing system including an interconnect architecture.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present invention. It will be apparent, however, to one skilled in the art that these specific details need not be employed to practice the present invention. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present invention.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most fabrics to provide highest possible performance with maximum power saving. Below, a number of interconnects are discussed, which would potentially benefit from aspects of the invention described herein.

One interconnect fabric architecture includes the Peripheral Component Interconnect (PCI) Express (PCIe) architecture. A primary goal of PCIe is to enable components and devices from different vendors to inter-operate in an open architecture, spanning multiple market segments; Clients (Desktops and Mobile), Servers (Standard and Enterprise), and Embedded and Communication devices. PCI Express is a high performance, general purpose I/O interconnect defined for a wide variety of future computing and communication platforms. Some PCI attributes, such as its usage model, load-store architecture, and software interfaces, have been maintained through its revisions, whereas previous parallel bus implementations have been replaced by a highly scalable, fully serial interface. The more recent versions of PCI Express take advantage of advances in point-to-point interconnects, Switch-based technology, and packetized protocol to deliver new levels of performance and features. Power Management, Quality Of Service (QoS), Hot-Plug/

Hot-Swap support, Data Integrity, and Error Handling are among some of the advanced features supported by PCI Express.

Referring to FIG. 1, an embodiment of a fabric composed of point-to-point Links that interconnect a set of components is illustrated. System 100 includes processor 105 and system memory 110 coupled to controller hub 115. Processor 105 includes any processing element, such as a microprocessor, a host processor, an embedded processor, a co-processor, or other processor. Processor 105 is coupled to controller hub 115 through front-side bus (FSB) 106. In one embodiment, FSB 106 is a serial point-to-point interconnect as described below. In another embodiment, link 106 includes a serial, differential interconnect architecture that is compliant with different interconnect standard.

System memory 110 includes any memory device, such as random access memory (RAM), non-volatile (NV) memory, or other memory accessible by devices in system 100. System memory 110 is coupled to controller hub 115 through memory interface 116. Examples of a memory interface include a double-data rate (DDR) memory interface, a dual-channel DDR memory interface, and a dynamic RAM (DRAM) memory interface.

In one embodiment, controller hub 115 is a root hub, root complex, or root controller in a Peripheral Component Interconnect Express (PCIe or PCIE) interconnection hierarchy. Examples of controller hub 115 include a chipset, a memory controller hub (MCH), a northbridge, an interconnect controller hub (ICH) a southbridge, and a root controller/hub. Often the term chipset refers to two physically separate controller hubs, i.e. a memory controller hub (MCH) coupled to an interconnect controller hub (ICH). Note that current systems often include the MCH integrated with processor 105, while controller 115 is to communicate with I/O devices, in a similar manner as described below. In some embodiments, peer-to-peer routing is optionally supported through root complex 115.

Here, controller hub 115 is coupled to switch/bridge 120 through serial link 119. Input/output modules 117 and 121, which may also be referred to as interfaces/ports 117 and 121, include/implement a layered protocol stack to provide communication between controller hub 115 and switch 120. In one embodiment, multiple devices are capable of being coupled to switch 120.

Switch/bridge 120 routes packets/messages from device 125 upstream, i.e. up a hierarchy towards a root complex, to controller hub 115 and downstream, i.e. down a hierarchy away from a root controller, from processor 105 or system memory 110 to device 125. Switch 120, in one embodiment, is referred to as a logical assembly of multiple virtual PCI-to-PCI bridge devices. Device 125 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 125 may include a PCIe to PCI/PCI-X bridge to support legacy or other version PCI devices. Endpoint devices in PCIe are often classified as legacy, PCIe, or root complex integrated endpoints.

Graphics accelerator 130 is also coupled to controller hub 115 through serial link 132. In one embodiment, graphics accelerator 130 is coupled to an MCH, which is coupled to an ICH. Switch 120, and accordingly I/O device 125, is then coupled to the ICH. I/O modules 131 and 118 are also to implement a layered protocol stack to communicate between graphics accelerator 130 and controller hub 115. Similar to the MCH discussion above, a graphics controller or the graphics accelerator 130 itself may be integrated in processor 105.

Figure 2:
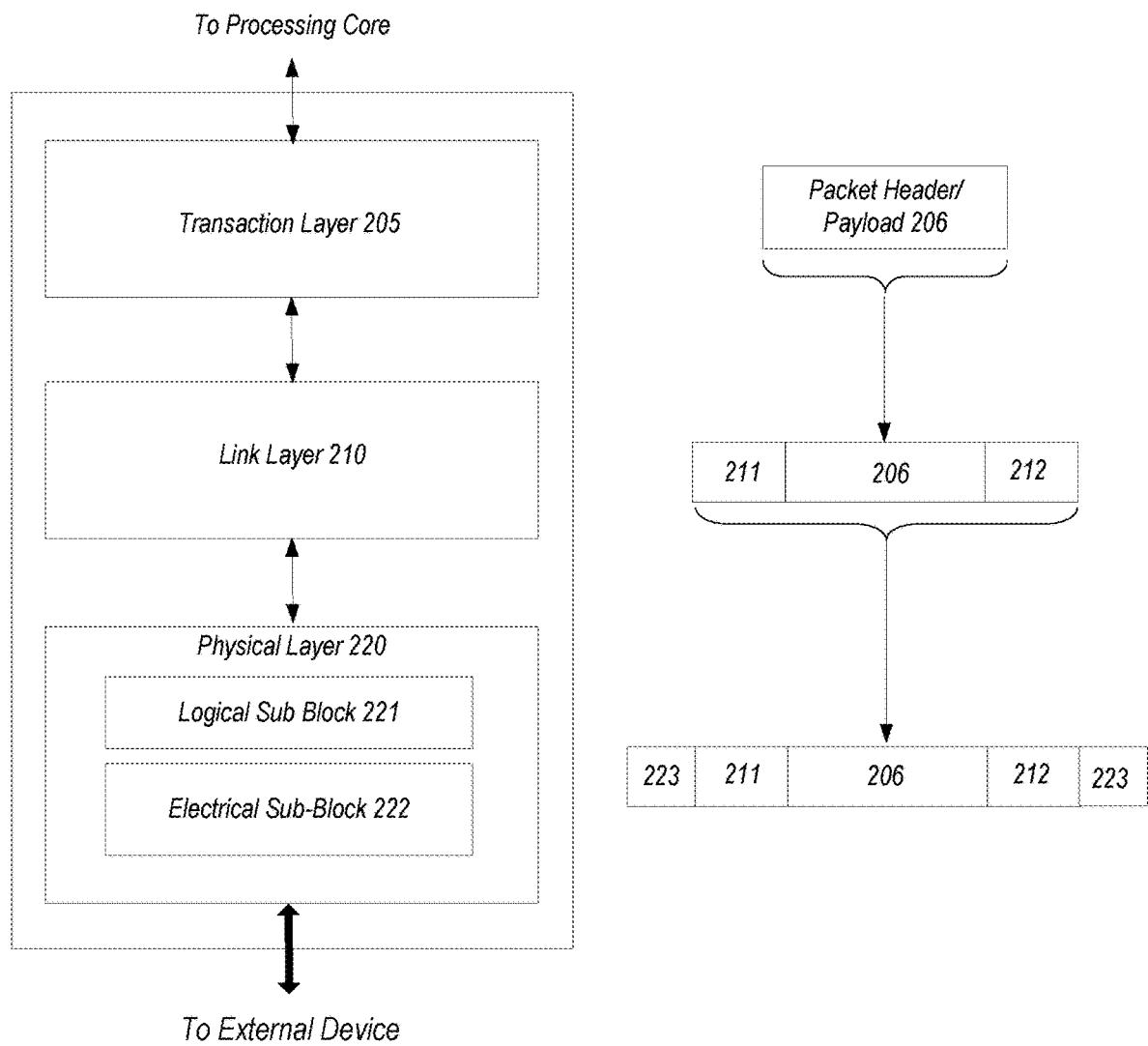
FIG. 2 illustrates an embodiment of a interconnect architecture including a layered stack.

Turning to FIG. 2 an embodiment of a layered protocol stack is illustrated. Layered protocol stack 150 includes any form of a layered communication stack, such as a Quick Path Interconnect (QPI) stack, a PCIe stack, a next generation high performance computing interconnect stack, or other layered stack. Although the discussion immediately below in reference to FIGS. 1-4 are in relation to a PCIe stack, the same concepts may be applied to other interconnect stacks. In one embodiment, protocol stack 150 is a PCIe protocol stack including transaction layer 155, link layer 210, and physical layer 220. An interface, such as interfaces 117, 118, 121, 122, 126, and 131 in FIG. 1, may be represented as communication protocol stack 150. Representation as a communication protocol stack may also be referred to as a module or interface implementing/including a protocol stack.

PCI Express uses packets to communicate information between components. Packets are formed in the Transaction Layer 155 and Data Link Layer 210 to carry the information from the transmitting component to the receiving component. As the transmitted packets flow through the other layers, they are extended with additional information necessary to handle packets at those layers. At the receiving side the reverse process occurs and packets get transformed from their Physical Layer 220 representation to the Data Link Layer 210 representation and finally (for Transaction Layer Packets) to the form that can be processed by the Transaction Layer 155 of the receiving device.

Transaction Layer

In one embodiment, transaction layer 155 is to provide an interface between a device's processing core and the interconnect architecture, such as data link layer 210 and physical layer 220. In this regard, a primary responsibility of the transaction layer 155 is the assembly and disassembly of packets (i.e., transaction layer packets, or TLPs). The translation layer 155 typically manages credit-base flow control for TLPs. PCIe implements split transactions, i.e. transactions with request and response separated by time, allowing a link to carry other traffic while the target device gathers data for the response.

In addition PCIe utilizes credit-based flow control. In this scheme, a device advertises an initial amount of credit for each of the receive buffers in Transaction Layer 155. An external device at the opposite end of the link, such as controller hub 115 in FIG. 1, counts the number of credits consumed by each TLP. A transaction may be transmitted if the transaction does not exceed a credit limit. Upon receiving a response an amount of credit is restored. An advantage of a credit scheme is that the latency of credit return does not affect performance, provided that the credit limit is not encountered.

In one embodiment, four transaction address spaces include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address.

Configuration space transactions are used to access configuration space of the PCIe devices. Transactions to the configuration space include read requests and write requests. Message transactions are defined to support in-band communication between PCIe agents.

Therefore, in one embodiment, transaction layer 155 assembles packet header/payload 156. Format for current packet headers/payloads may be found in the PCIe specification at the PCIe specification website.

Figure 3:
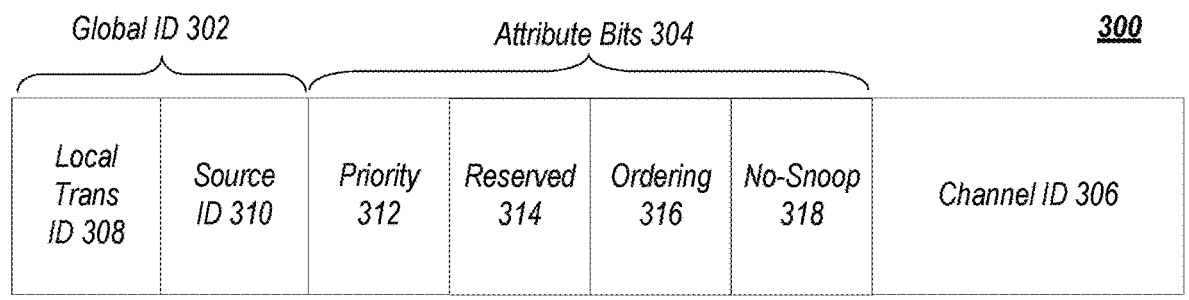
FIG. 3 illustrates an embodiment of a request or packet to be generated or received within an interconnect architecture.

Quickly referring to FIG. 3, an embodiment of a PCIe transaction descriptor is illustrated. In one embodiment, transaction descriptor 300 is a mechanism for carrying transaction information. In this regard, transaction descriptor 300 supports identification of transactions in a system. Other potential uses include tracking modifications of default transaction ordering and association of transaction with channels.

Transaction descriptor 300 includes global identifier field 302, attributes field 304 and channel identifier field 306. In the illustrated example, global identifier field 302 is depicted comprising local transaction identifier field 308 and source identifier field 310. In one embodiment, global transaction identifier 302 is unique for all outstanding requests.

According to one implementation, local transaction identifier field 308 is a field generated by a requesting agent, and it is unique for all outstanding requests that require a completion for that requesting agent. Furthermore, in this example, source identifier 310 uniquely identifies the requestor agent within a PCIe hierarchy. Accordingly, together with source ID 310, local transaction identifier 308 field provides global identification of a transaction within a hierarchy domain.

Attributes field 304 specifies characteristics and relationships of the transaction. In this regard, attributes field 304 is potentially used to provide additional information that allows modification of the default handling of transactions. In one embodiment, attributes field 304 includes priority field 312, reserved field 314, ordering field 316, and no-snoop field 318. Here, priority sub-field 312 may be modified by an initiator to assign a priority to the transaction. Reserved attribute field 314 is left reserved for future, or vendor-defined usage. Possible usage models using priority or security attributes may be implemented using the reserved attribute field.

In this example, ordering attribute field 316 is used to supply optional information conveying the type of ordering that may modify default ordering rules. According to one example implementation, an ordering attribute of "0" denotes default ordering rules are to apply, wherein an ordering attribute of "1" denotes relaxed ordering, wherein writes can pass writes in the same direction, and read completions can pass writes in the same direction. Snoop attribute field 318 is utilized to determine if transactions are snooped. As shown, channel ID Field 306 identifies a channel that a transaction is associated with.

Link Layer

Link layer 210, also referred to as data link layer 210, acts as an intermediate stage between transaction layer 155 and the physical layer 220. In one embodiment, a responsibility of the data link layer 210 is providing a reliable mechanism for exchanging Transaction Layer Packets (TLPs) between two components a link. One side of the Data Link Layer 210 accepts TLPs assembled by the Transaction Layer 155, applies packet sequence identifier 211, i.e. an identification number or packet number, calculates and applies an error detection code, i.e. CRC 212, and submits the modified TLPs to the Physical Layer 220 for transmission across a physical to an external device.

Physical Layer

In one embodiment, physical layer 220 includes logical sub block 221 and electrical sub-block 222 to physically transmit a packet to an external device. Here, logical sub-block 221 is responsible for the "digital" functions of Physical Layer 221. In this regard, the logical sub-block includes a transmit section to prepare outgoing information for transmission by physical sub-block 222, and a receiver section to identify and prepare received information before passing it to the Link Layer 210.

Physical block 222 includes a transmitter and a receiver. The transmitter is supplied by logical sub-block 221 with symbols, which the transmitter serializes and transmits onto to an external device. The receiver is supplied with serialized symbols from an external device and transforms the received signals into a bit-stream. The bit-stream is de-serialized and supplied to logical sub-block 221. In one embodiment, an 8b/10b transmission code is employed, where ten-bit symbols are transmitted/received. Here, special symbols are used to frame a packet with frames 223. In addition, in one example, the receiver also provides a symbol clock recovered from the incoming serial stream.

As stated above, although transaction layer 155, link layer 210, and physical layer 220 are discussed in reference to a specific embodiment of a PCIe protocol stack, a layered protocol stack is not so limited. In fact, any layered protocol may be included/implemented. As an example, an port/interface that is represented as a layered protocol includes: (1) a first layer to assemble packets, i.e. a transaction layer; a second layer to sequence packets, i.e. a link layer; and a third layer to transmit the packets, i.e. a physical layer. As a specific example, a common standard interface (CSI) layered protocol is utilized.

Figure 4:
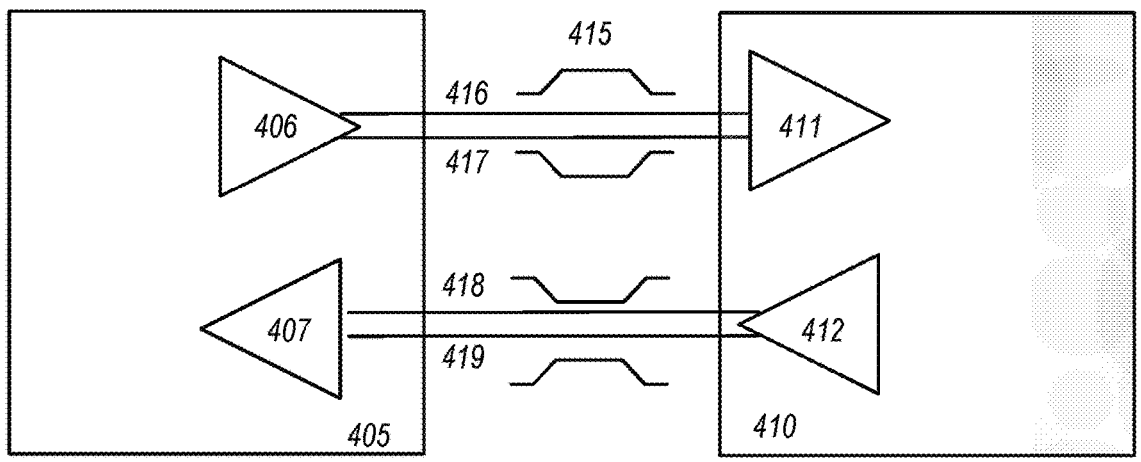
FIG. 4 illustrates an embodiment of a transmitter and receiver pair for an interconnect architecture.

Referring next to FIG. 4, an embodiment of a PCIe serial point to point fabric is illustrated. Although an embodiment of a PCIe serial point-to-point link is illustrated, a serial point-to-point link is not so limited, as it includes any transmission path for transmitting serial data. In the embodiment shown, a basic PCIe link includes two, low-voltage, differentially driven signal pairs: a transmit pair 406/411 and a receive pair 412/407. Accordingly, device 405 includes transmission logic 406 to transmit data to device 410 and receiving logic 407 to receive data from device 410. In other words, two transmitting paths, i.e. paths 416 and 417, and two receiving paths, i.e. paths 418 and 419, are included in a PCIe link.

A transmission path refers to any path for transmitting data, such as a transmission line, a copper line, an optical line, a wireless communication channel, an infrared communication link, or other communication path. A connection between two devices, such as device 405 and device 410, is referred to as a link, such as link 415. A link may support one lane—each lane representing a set of differential signal pairs (one pair for transmission, one pair for reception). To scale bandwidth, a link may aggregate multiple lanes denoted by xN, where N is any supported Link width, such as 1, 2, 4, 8, 12, 16, 32, 64, or wider.

A differential pair refers to two transmission paths, such as lines 416 and 417, to transmit differential signals. As an example, when line 416 toggles from a low voltage level to a high voltage level, i.e. a rising edge, line 417 drives from a high logic level to a low logic level, i.e. a falling edge. Differential signals potentially demonstrate better electrical characteristics, such as better signal integrity, i.e. crosscoupling, voltage overshoot/undershoot, ringing, etc. This allows for better timing window, which enables faster transmission frequencies.

Figure 5:
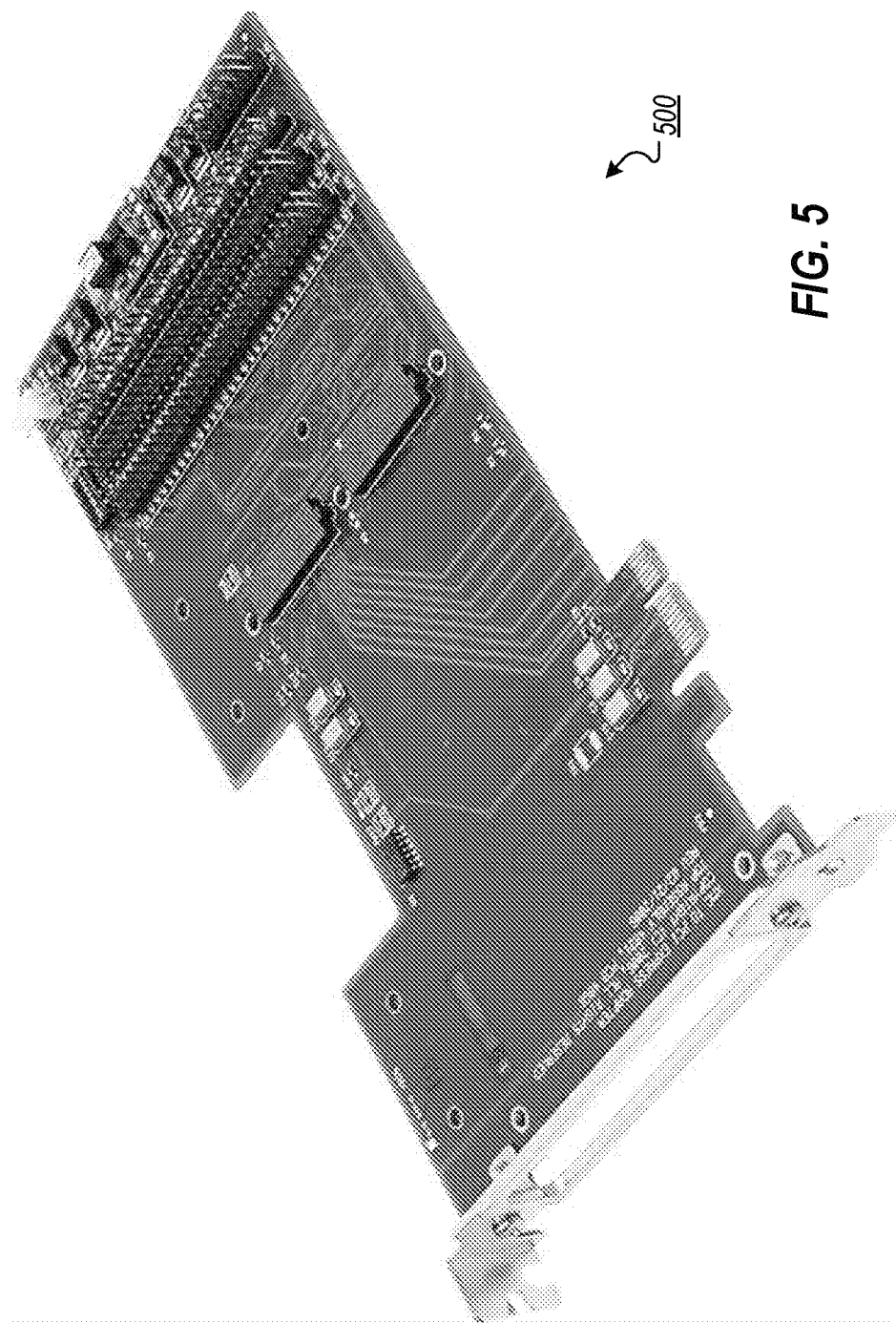
FIG. 5 illustrates an example add-in card device.
Figure 6:
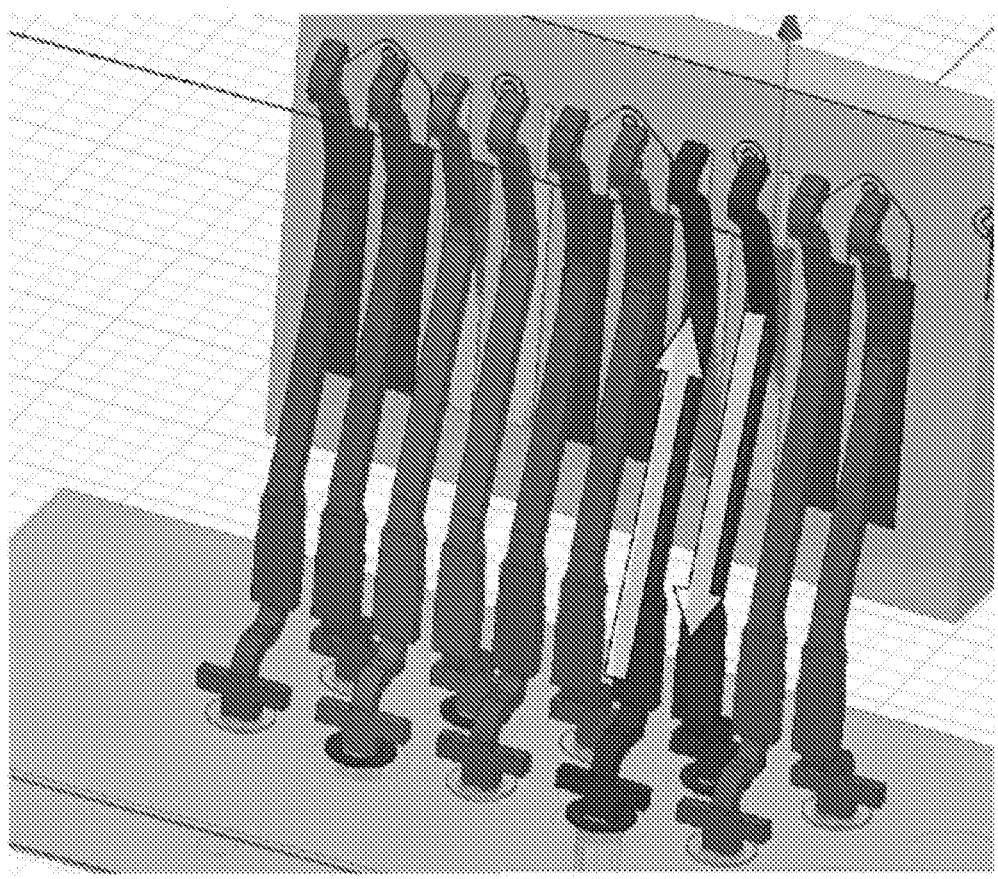
FIG. 6 illustrates a representation of an example connector interface including differential signal pairs and ground conductors.

FIG. 5 illustrates an example add-in card that can be mounted to a baseboard 500 so as to communicatively couple to the baseboard by one of a set of conductors. The add-card can be configured for a specific purpose, so as to extend functionality of the computer to which it is connected (e.g., through the computer's baseboard). In one example implementation, the add-in card comprises a device compatible with a PCI-based interconnect protocol, such as PCIe. FIG. 6 illustrates the use of differential pairs in PCIe connector 600, shown as an add-in card (AIC) mounted to a baseboard. All contacts can be electrically isolated from one another by airspace and a plastic connector shell (not shown). Conductors 610 and 612 can be utilized to represent a first differential pair, capable of carrying equal and opposite currents to balance the signal integrity effects. Likewise, in this example, conductors 620 and 622 represent a second differential pair. Additional conductors can be provided and utilized for ground, sideband, and other terminations. For instance, ground conductor pairs 630 and 632, 640 and 642, and 650 and 652 can be provided, which are joined only at the printed circuit board (PCB) level (baseboard and AIC). In some implementations, a ground conductor (e.g., 642) adjacent to a signal conductor (e.g., 610) of a differential pair may balance some of the return current (in addition to 612). (It should be noted that in other implementations the signals are not differential. This, however, does not necessarily limit the applicability of the concepts described herein, as the above concepts can be applied to other systems, including signals that are non-differential signals.)

Continuing with the example of FIG. 6, among the conductors, several sideband pins may be provided among the high speed differential pairs and grounds. Sideband pins can be utilized, in some implementations, for low speed or DC signals. In some cases, sideband pins may be unused. In some instances, such as in some PCIe-compliant connectors, sideband conductors can exhibit a resonance due to the signaling on nearby high speed lanes (or conductors). This resonance can generates a strong crosstalk peak, such as a peak falling at about 5 GHz, in the middle of the 0-8 GHz bandwidth of Gen4. This resonance can also cause a corresponding dropout in insertion loss at the same frequency. The resonance is a result of electromagnetic coupling among the conducting pinfield vias, connector pins and contacts, and add-in card (AIC) edge fingers, combined with the fact that these conductors are typically unterminated, or terminated in a highly mismatched impedance. This resonance may be present in both surface mount and thru-hole versions of the PCIe connector, and in ×1, ×4, ×8, and ×16 widths, among other examples.

In some implementations, a mechanism can be provided for reducing crosstalk in connectors. More particularly, in some implementations of high speed interconnects, such as the PCI Express (PCIe) connector interface, crosstalk is manifest stemming from a resonance in unterminated or poorly terminated sideband pins. This crosstalk can be mitigated by attaching an AC-coupled termination network that will effectively damp the resonance without disrupting the assigned electrical function of the connector pin. Such circuitry may be applied to other connectors and, potentially, socket pins, among other examples.

In earlier, lower-bandwidth generations of PCIe (and other interconnects) these crosstalk issues were less troublesome. However, with the higher bandwidth requirements of more recent versions (e.g., 16 GT/s PCIe Gen4 channels), increased sensitivity to these crosstalk mechanisms is observed. While only a subset of the connector's high speed lanes may be affected by this resonance, these vulnerable lanes serve to limit the overall link bandwidth. Further, in the example of PCIe, these resonance issues are present in most PCIe connector interfaces, including the ×1, ×4, ×8, and ×16 styles. While degraded channel performance can be partially offset using other methods, such as shortening the channel length, or replacing connectors with much more expensive backplane connectors, such alternatives can limit the scope of the channel's utility and may not be compatible with some applications. For instance, replacing edge connectors with higher performance backplane connectors can make it impossible to realize interconnects that guarantee backward compatibility (e.g., backward compatibility among PCIe Generation 1-2-3-4 baseboards and add-in cards), among other examples.

In one implementation, a passive series resistor—capacitor (RC) termination network can be applied between the PCIe connector sideband pins and ground. While the present disclosure discusses several examples where the network only includes a simple termination R-C network, it should be appreciated that more complex AC termination networks are possible, using more than a single resistor and capacitor, for example. Further, it may be observed that termination to DC network other than Ground, such as a 3.3 Volt DC plane, may be possible, among other alternative implementations. Regardless, such networks can permit absorption of coupled energy to provide damping of resonant energy at higher frequencies (generally >100 MHz) on sideband channels without perturbing the operation of the sideband signals, which would otherwise result from excessive low frequency loading. In one implementation, the capacitor can be sized appropriately (e.g., 1 pF) to provide a capacitive reactance sufficiently low to pass the undesired coupled energy, while largely blocking low frequency and DC traffic. Such circuit enhancements, among other example advantages, may minimize crosstalk stemming from resonance manifesting on high speed links. Such solutions might also improve other metrics of channel quality such as insertion loss and return loss, among other examples.

Figure 7A:
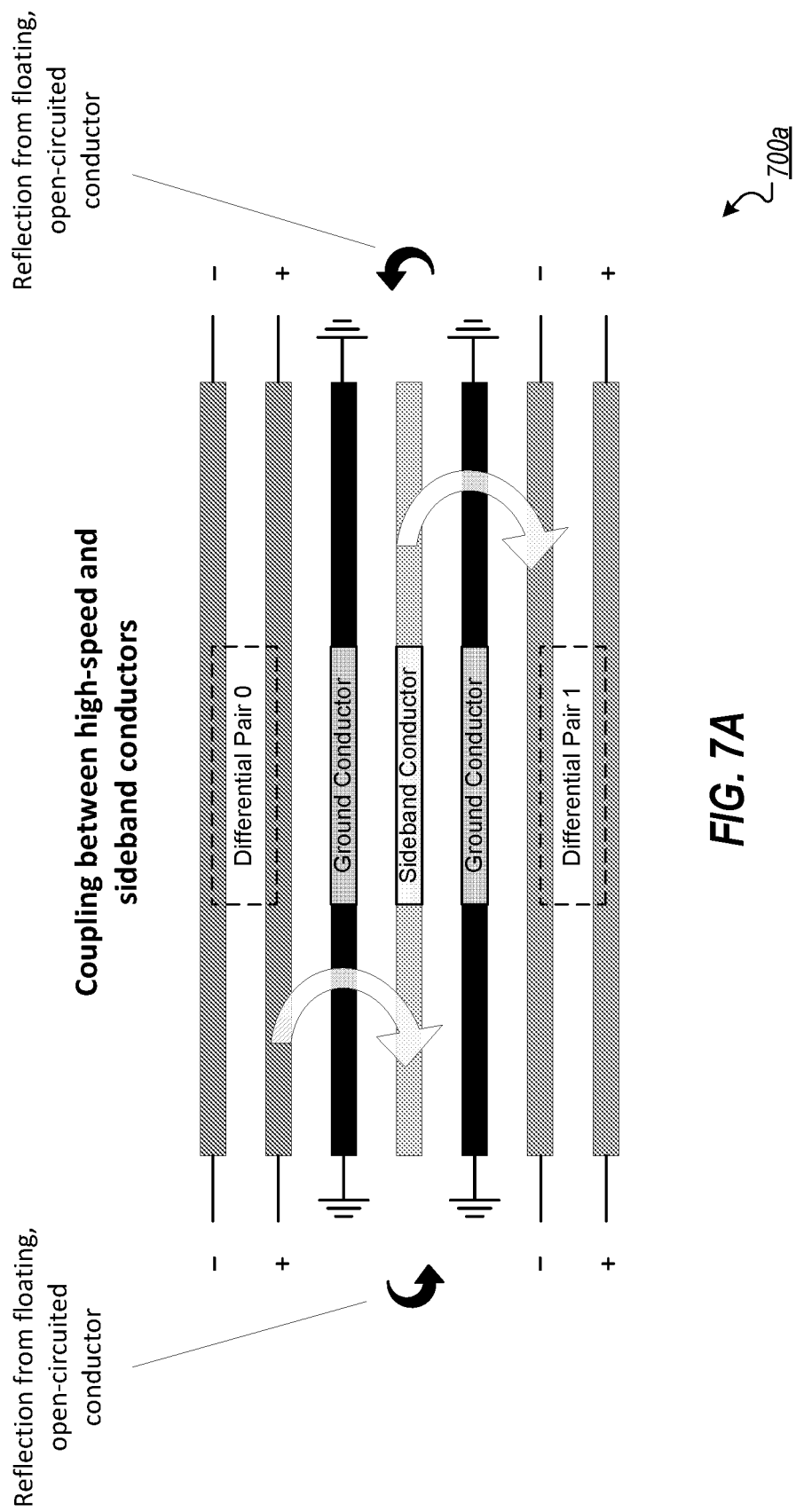
FIGS. 7A-7G illustrates simplified diagrams of example connectors.

FIGS. 7A-7G illustrate block diagrams representing example implementations of a multi-conductor connector that includes high speed differential pairs, grounds, and one or more other conductors that may be used to carry sideband signals (i.e., "sideband conductors"). For instance, FIG. 7A is a simplified block diagram 700a illustrating conductors of a conventional connector. In this example, the connector can include Differential Pair 0 and Differential Pair 1, each designated for carrying differential, high speed data signals. In FIG. 7A, the terminals of the sideband conductor are open-circuited permitting multiple reflections that lead to a resonance, whose frequency may be dictated by the length of the floating conductor. As noted above, this resonance can, in turn, manifest as crosstalk in neighboring differential conductors (e.g., conductors of Differential Pair 0 and Differential Pair 1), even when a ground conductor is positioned at least partially between the sideband conductor and high speed signaling conductors (e.g., Differential Pair 0 and Differential Pair 1).

Figure 7B:
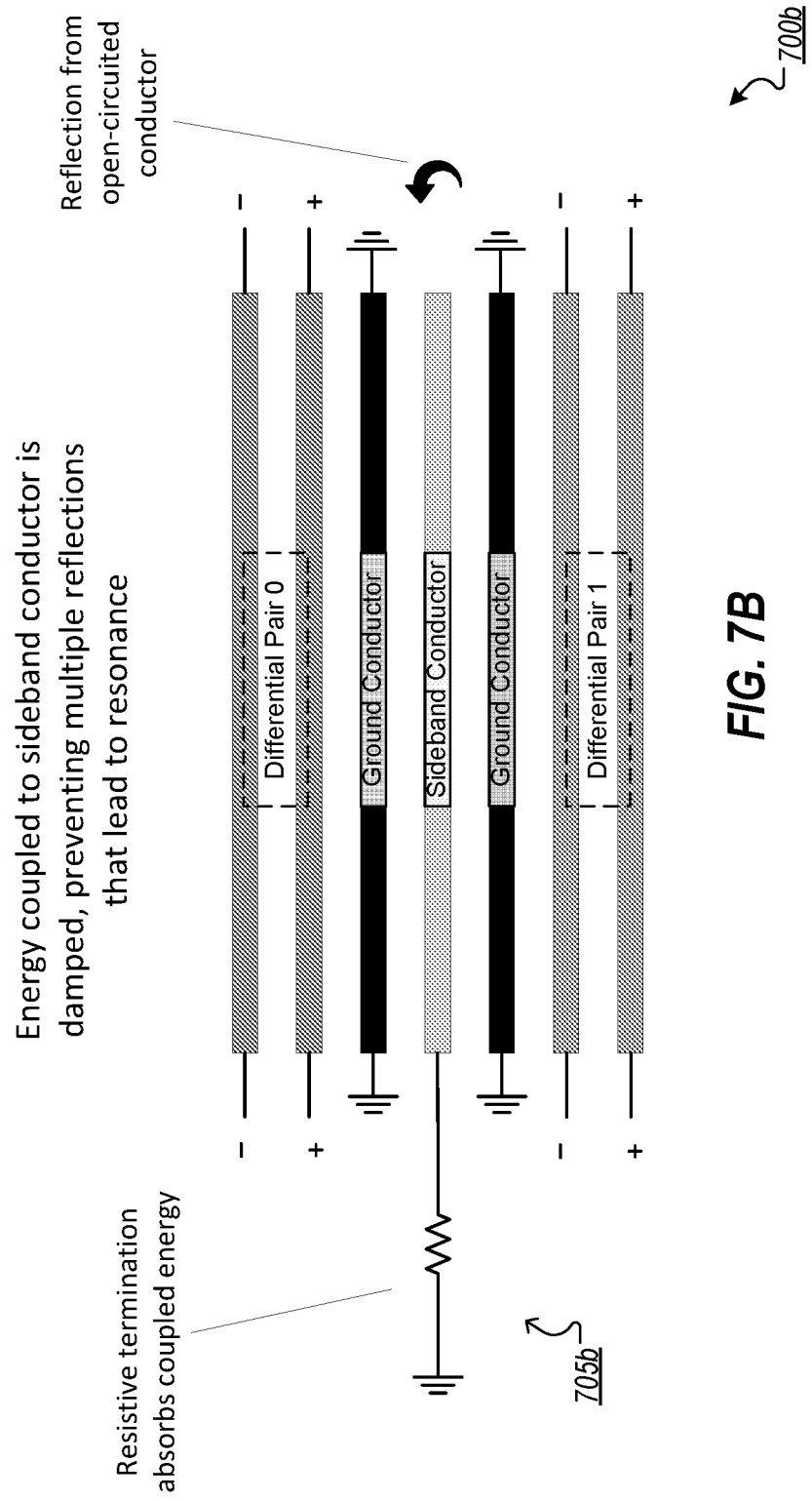
Figure 7C:
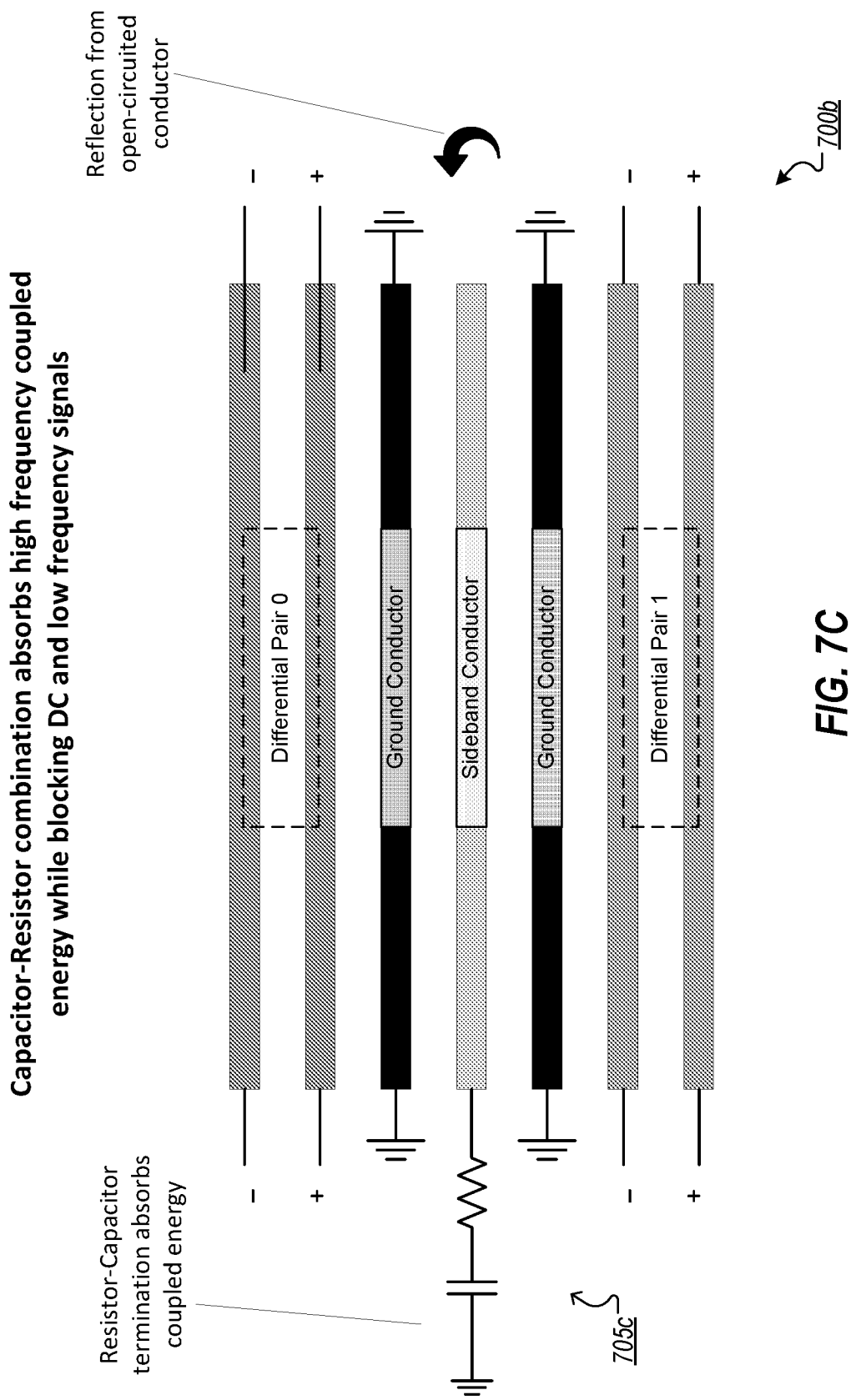

Turning to FIG. 7B, a simplified block diagram 700b is shown illustrating an implementation including circuitry 705b to remediate potential crosstalk resonance at the sideband conductors, wherein the sideband conductor is resistively terminated to ground to damp the resonance. In this example, the implementation of crosstalk remediation circuitry 705b effectively provides DC coupling. In some cases, such a DC-coupled solution may be limited in its application (e.g., cannot be applied to PCIe sideband signals). Accordingly, the simplified block diagram 700c of FIG. 7C illustrates another implementation including circuitry 705c to remediate potential crosstalk resonance at the sideband conductors. For instance, in the implementation of FIG. 7C, series capacitance is added to the solution of FIG. 7B to provide both AC decoupling and resistive termination through an RC remediation circuit.

Figure 7D:
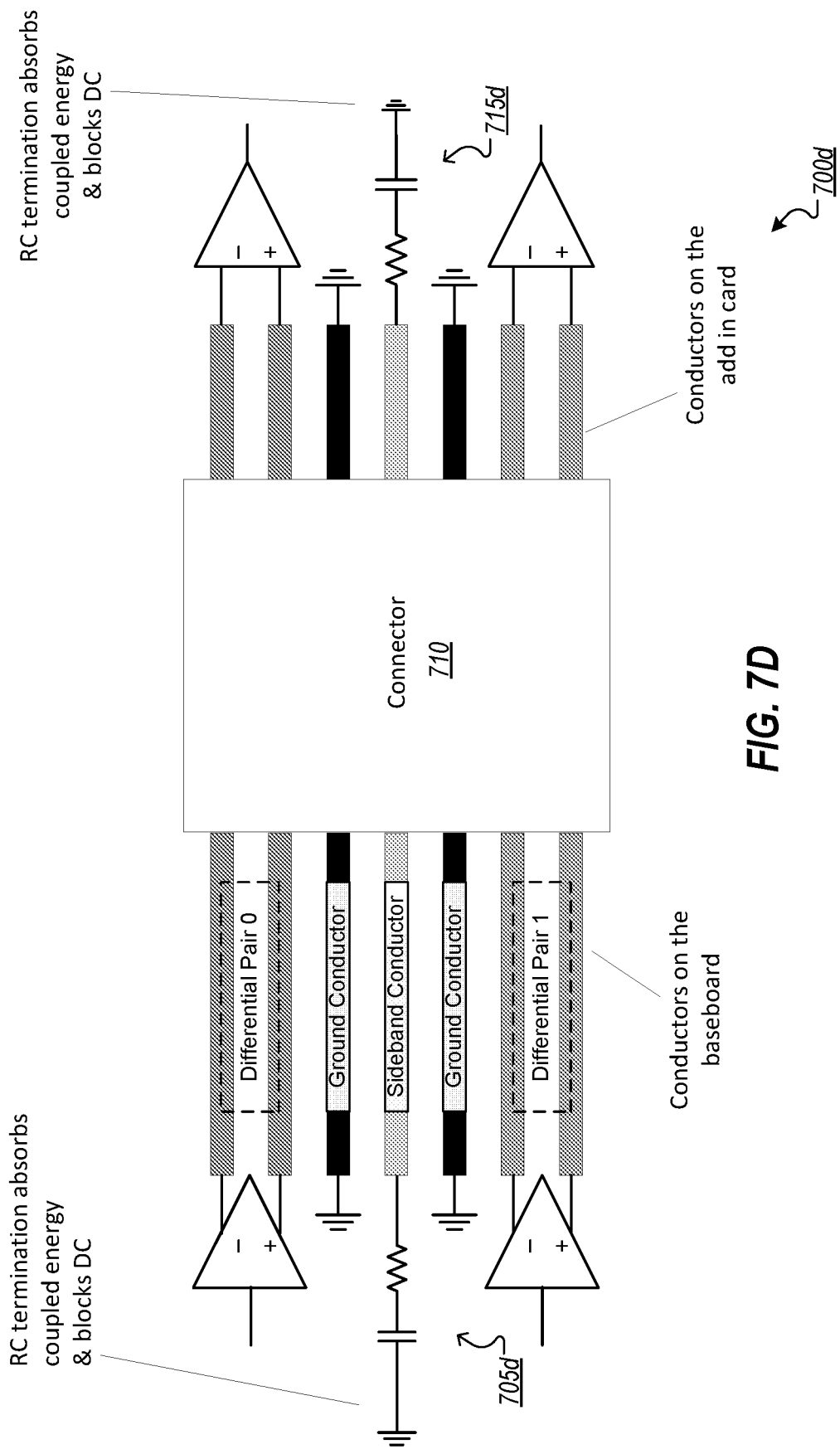
Figure 7E:
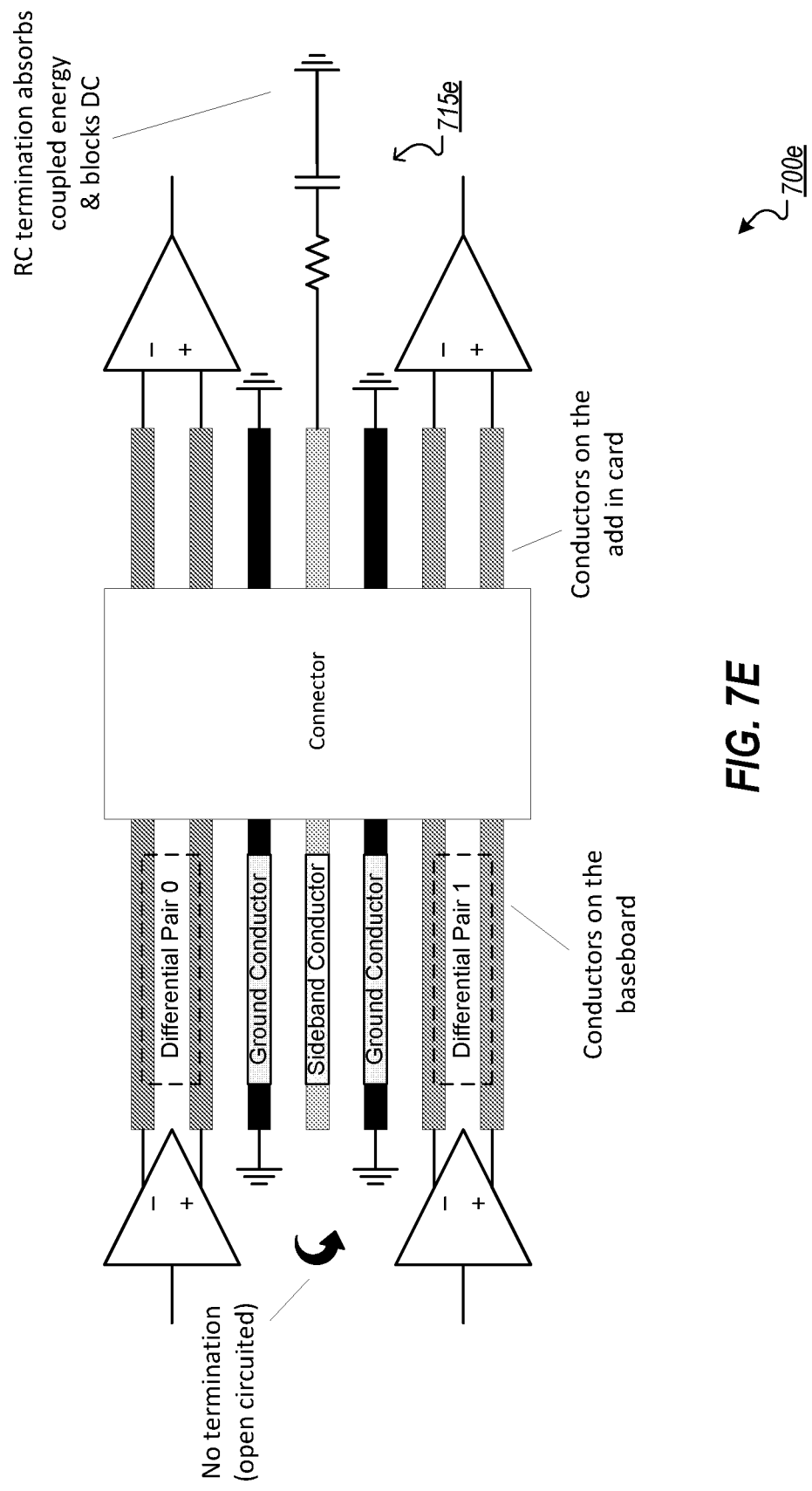
Figure 7F:
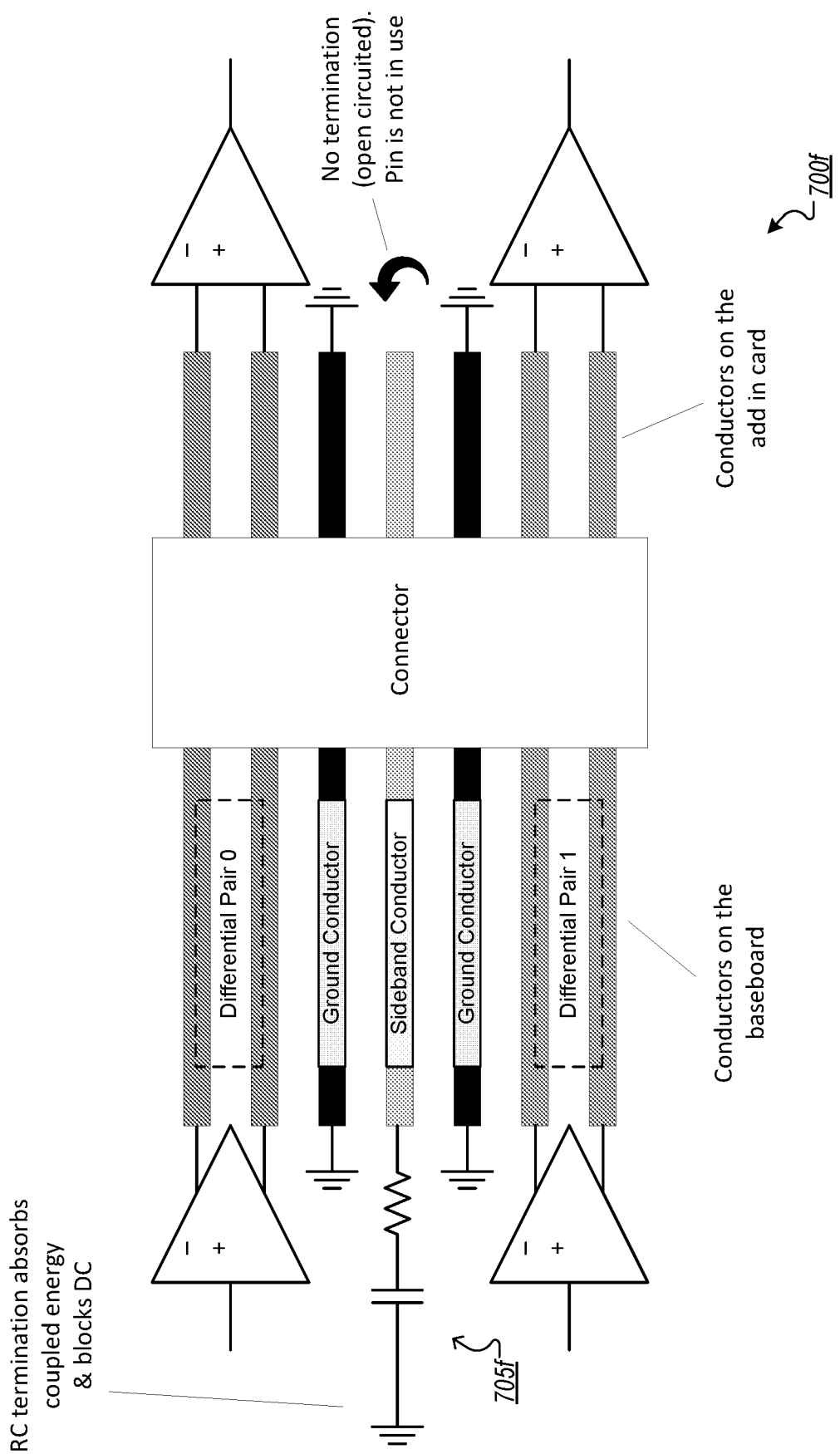

Remediation circuitry can effectively damp resonance even where terminations of the sideband conductors are connected to ground through remediation circuity at only one end of a connection. FIGS. 7D-7F are simplified block diagrams 700d-f illustrating additional implementations of sideband conductors provided with remediation circuitry, such as introduced in the examples of FIGS. 7B-7C. For instance, FIG. 7D shows a first device (e.g., an add-in card) connected to a second device (e.g., a board) via a connector 710. The first device can include one or more sideband conductors terminated to ground via remediation circuity 705d that includes a resistor and capacitor in series, such as illustrated in FIG. 7D. The second device can also be configured to terminate a corresponding sideband conductor to ground via a resistor and capacitor-based remediation circuit (e.g., 715d). This can represent an ideal termination of sideband conductors, with remediation circuity (705d, 715d) at both ends of a connection.

As introduced above, remediation circuity can be effective even when only applied to a sideband conductor at one end of a connection. For instance, FIG. 7E represents an alternative implementation of the example of FIG. 7D where remediation circuitry (e.g., 715e) is instead applied to a sideband conductor at a second device, but not at the corresponding sideband conductor of the first device to which the second device is connected (e.g., via a connector). Alternatively, the first device can apply the remediation circuity (e.g., 705f) while the second device does not, as illustrated in FIG. 7F.

Figure 7G:
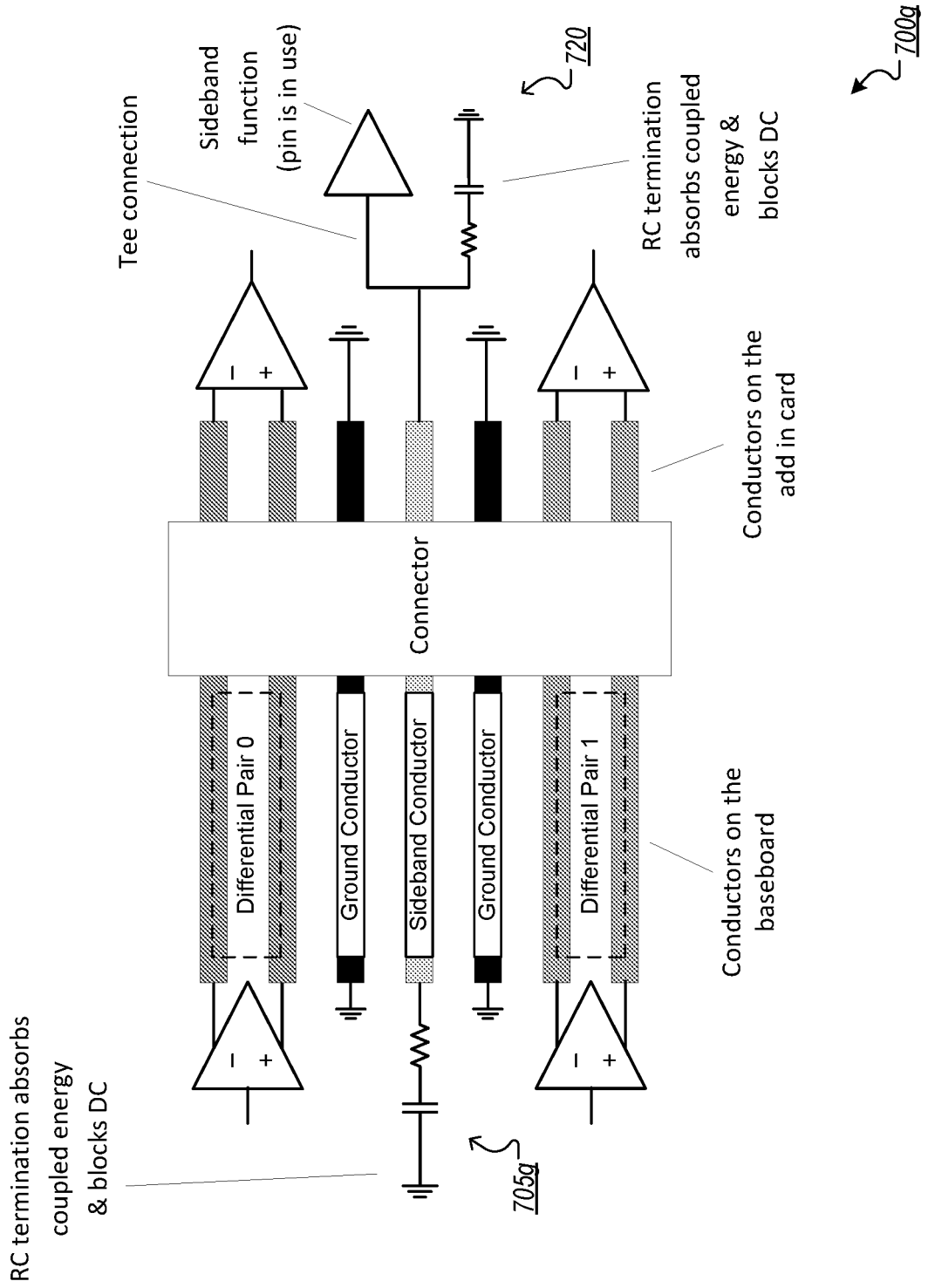

Turning to the example FIG. 7G, yet another example implementation is illustrated of remediation circuitry for provision on one or both terminations of a sideband conductor. In the particular example of FIG. 7G, at one side of a connection (i.e., at a second device), the remediation circuitry 720 for a sideband conductor includes a tee-connection, allowing the sideband conductor to implement an assigned circuit function, while remediation is provided through a resistor or resistor-capacitor termination forming an additional branch to the existing circuit routing that does not substantially interfere with the assigned function. The assigned function may involve termination at another component or device, among other examples. As further illustrated in the example of FIG. 7G, different types of remediation circuitry can be provided at each end of a sideband conductor, with remediation circuitry 705g (e.g., not with a tee-connection) provided at the termination of a first device, among other examples. In some cases, the impedance match achieved with the addition of AC termination networks will not be ideal. It is enough that the AC terminations substantially damp each reflection; even with an imperfect match, the presence of the AC termination networks (e.g., 705b-d, f,g, 715d-e, 720) will quickly damp any resonance stemming from energy exchanged with other coupled conductors.

Note that the simplified planar representations illustrated in FIGS. 7A-7G may not adequately represent the actual connector geometry; the baseboard, connector, and add-in card geometry suffers greater sideband conductor coupling than the 2D illustrations might imply. Further, as noted above, the principles described above can be applied to connections, devices, and systems compliant with a PCIe-based specification. For instance, in the case of PCIe Gen4, data rates may meet or exceed 16 GT/s. To support PCIe Gen4 traffic the frequency bandwidth may generally be considered to span the 0-8 GHz range. This exceeds the bandwidth of previous PCIe versions' connector interface, when the PCIe Gen3 Card Electromechanical Spec (CEM Spec) and common PCIe Gen 1-2-3 PCB design techniques are applied. In the pursuit of Gen4 readiness, numerous channel impairments that limit the performance of the connector have been identified (e.g., through electromagnetic component simulation as well as simulation at the channel level, and subsequently confirmed in hardware, using vector network analysis). Many of these effects have either been previously unknown or not addressed due in large part to the fact that many of these signal integrity problems did not affect Gen1-2-3 channels very strongly.

Figure 8:
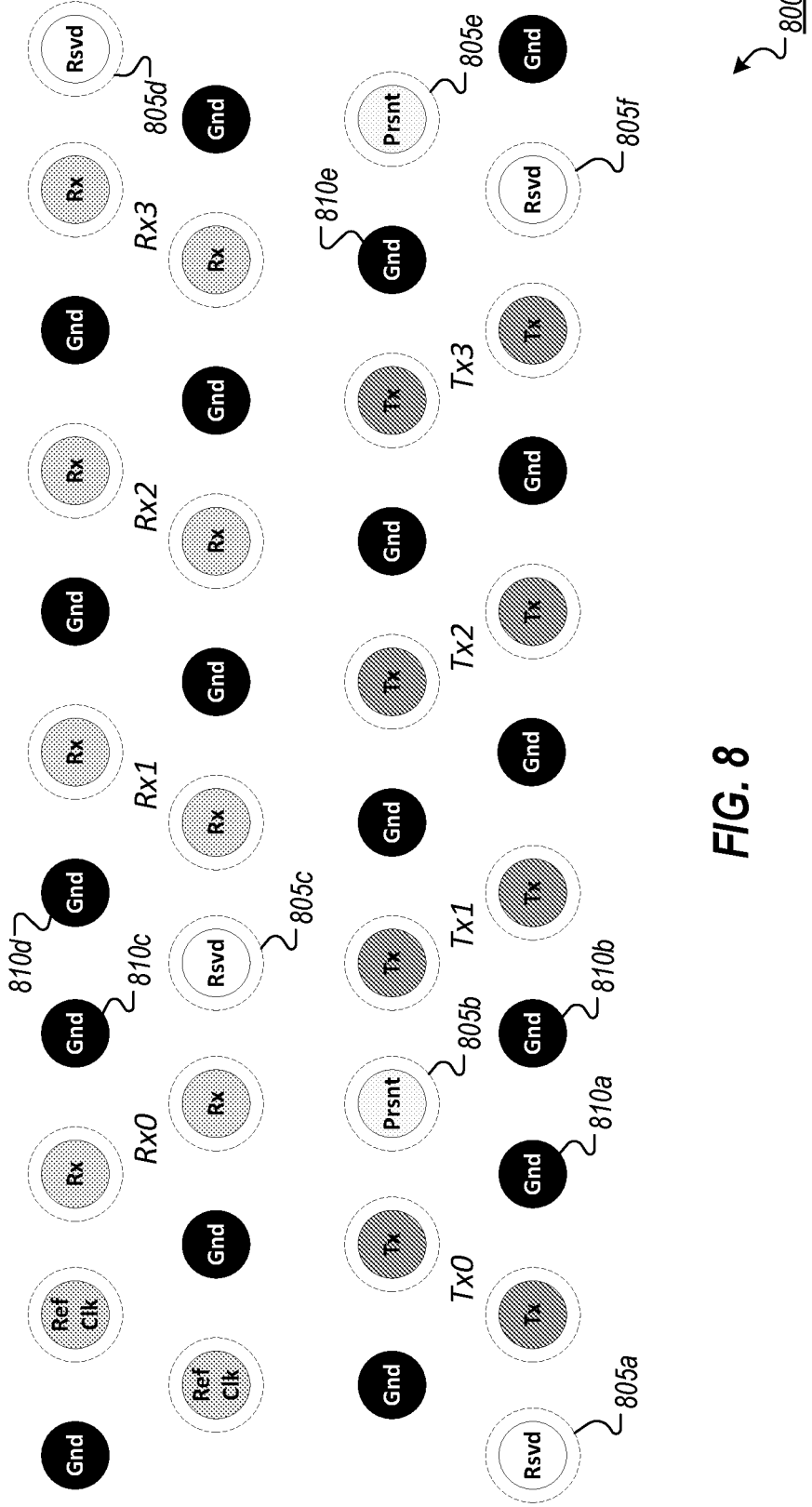
FIG. 8 illustrates a representation of a pinout of an example connector including one or more sideband conductors.

FIG. 8 illustrates a representation of at least a portion 800 of a pin field layout of a an example (e.g., PCIe) connector including one or more sideband conductors (e.g., 805a-f). Multiple high speed differential signaling pairs (e.g., Rx0, Rx1, Rx2, Tx0, Tx1, Tx2, etc.) can also be provided, as well as ground conductors (e.g., 810a-e). A variety of pinfield layouts can be provided on a connector. In some examples, such as that illustrated in FIG. 8, ground conductors (e.g., 810a-e) can be positioned relative to different signaling pairs and sideband conductors to assist in absorbing signals from neighboring conductors (e.g., high speed differential signaling pairs and sideband conductors) to assist in preventing crosstalk. For instance, ground conductors may be provided between two potentially competing conductors, such as ground conductor 810a between Tx0 and sideband 805b, or ground conductor 810e between Tx3 and sideband conductors 805e and 805f, etc. Resonance appearing on unterminated sideband conductors (e.g., 805e) may nonetheless cause crosstalk to manifest on a nearby high speed signaling conductor (e.g., in Tx3), despite the presence (and partial assistance) of ground conductor. Provisioning one or more (or all) of the sideband conductors (e.g., 805a-f) with remediation circuitry at the sidebands' terminations (such as described above) can remediate such resonance and protect signaling on nearby conductors from interference emanating on the sideband conductor, all while allowing (e.g., lower frequency or DC) sideband signals to be successfully communicated using the sideband conductors.

Figure 9:
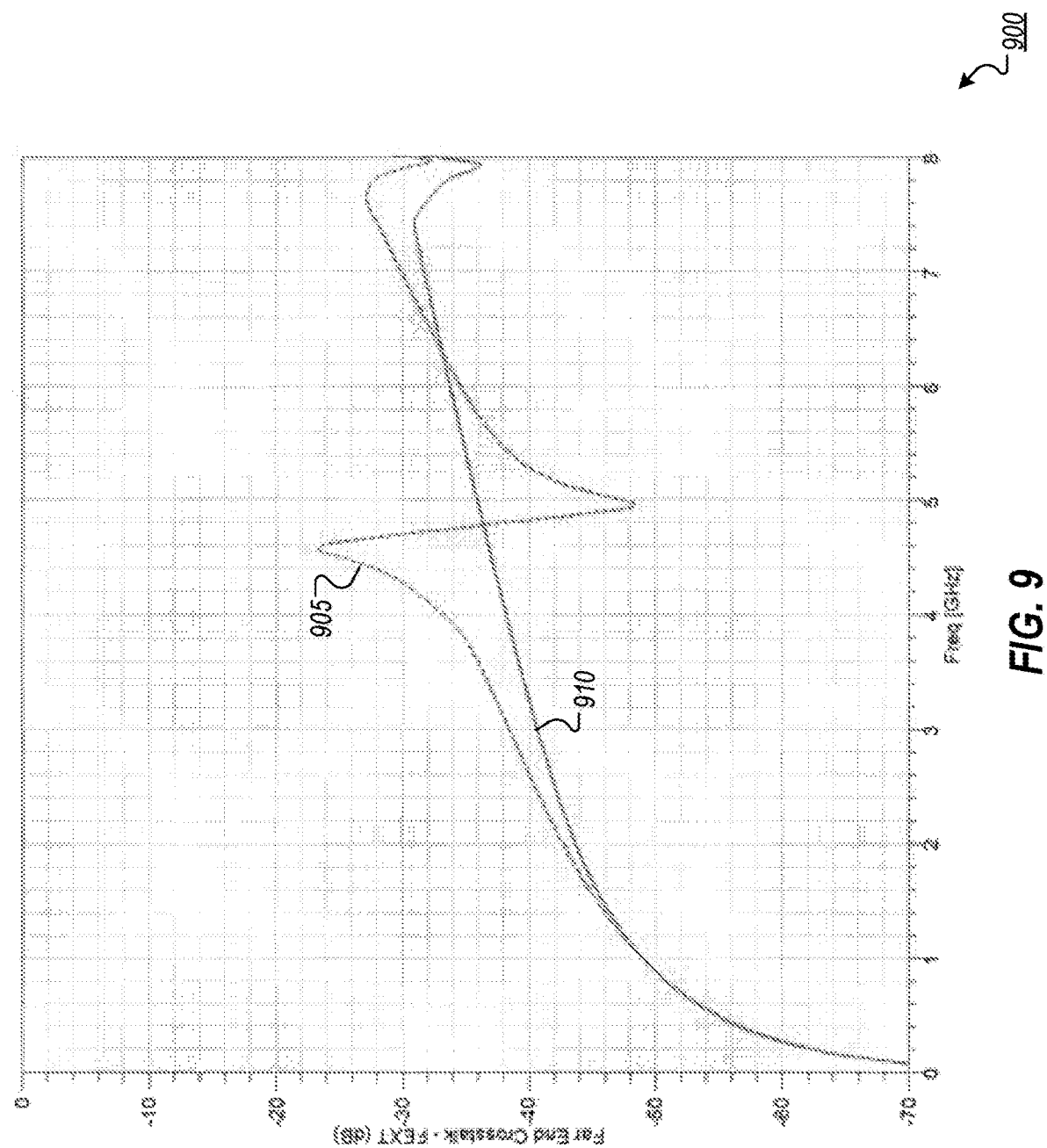
FIG. 9 illustrates a graph illustrating crosstalk characteristics of example connectors.

As noted above, the principles described above can be applied in PCIe-based connectors and interconnects to improve signal quality. For instance, high speed PCIe Gen4 traffic may be particular susceptible to channel impediments caused by sideband channels of PCIe connectors. Indeed, sideband conductor resonance can be a prominent interference mechanism, manifested as a strong crosstalk peak that is a consequence of having unterminated sideband pins. For instance, FIG. 9 shows a graph 900 illustrating a comparison of the crosstalk among high speed pairs adjacent to sideband pins that are terminated either with an open circuit or a matched resistance. The crosstalk peak of the dashed trace 905 near 5 GHz is a consequence of the undamped resonance in the unterminated baseline configuration. The solid line 910 illustrates the crosstalk reduction when AC termination is applied (such as with the example remediation circuitry discussed above), demonstrating the effectiveness of such sideband termination solutions.

As discussed above, a remediation circuit can include either a resistor (introducing impedance to the sideband conductor) alone or a resistor and capacitor in series. In the case of a remediation circuit with a resistor only, a simple resistive termination may disrupt the assigned function of the sideband pins, which prompted this invention. If left unconnected, the sideband pins can function as undamped, high-Q resonators that absorb and emit energy from/to neighboring pins. A resistor connected to one or both ends of the unterminated networks will absorb (or damp) the energy that would otherwise be re-emitted, to manifest as crosstalk peaks or insertion loss dropouts. The sideband pins that are currently assigned carry only very low frequency or DC traffic, so an appropriately sized termination resistor alone (perhaps 50Ω) would heavily load these networks, and would interfere with the function of the pins. Adding a capacitor in series with the resistor can cure this disruption while preserving the remedial properties of the circuit.

Figure 10:
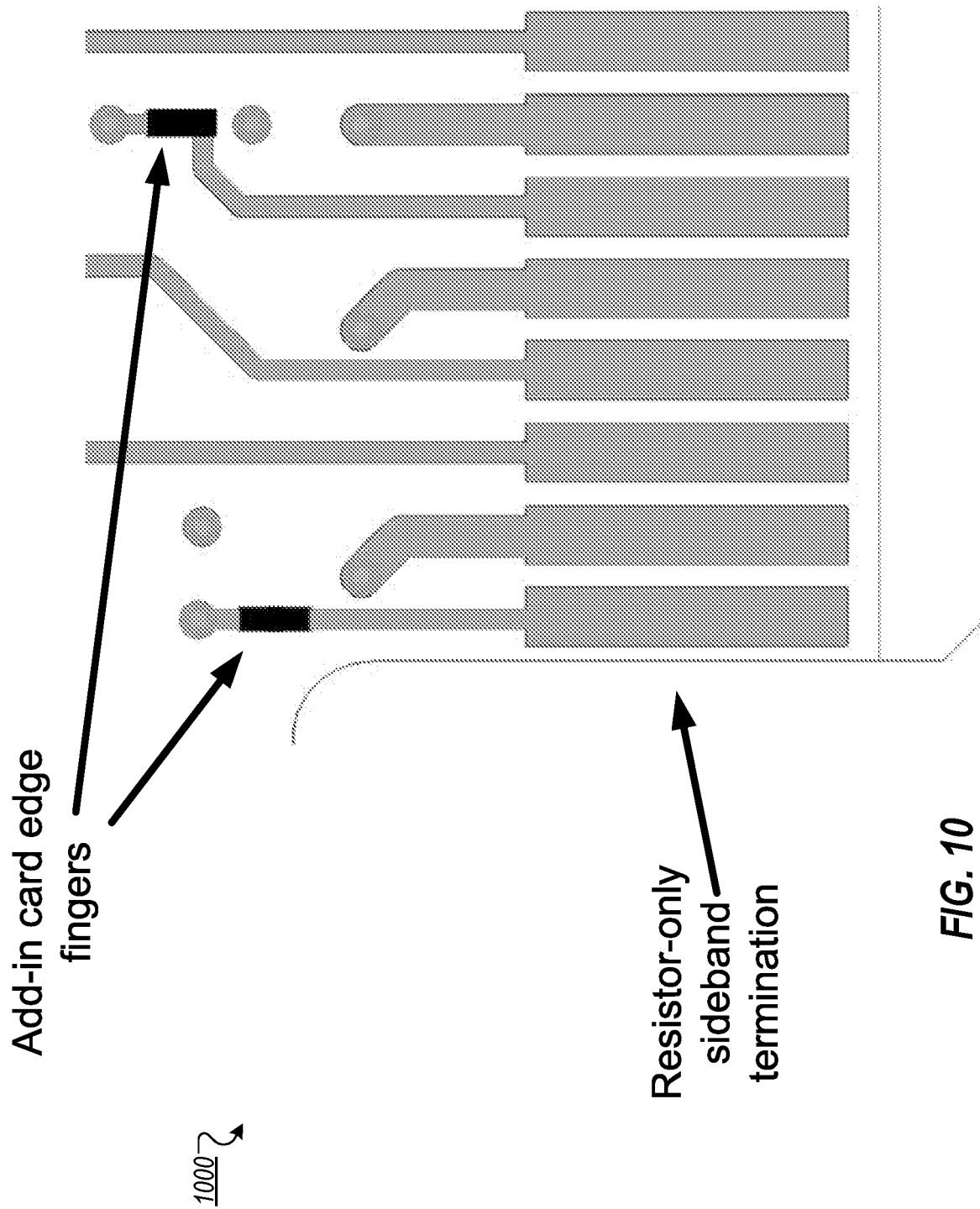
FIG. 10 illustrates a representation of an example card edge pinfield including one or more sideband conductors.
Figure 11:
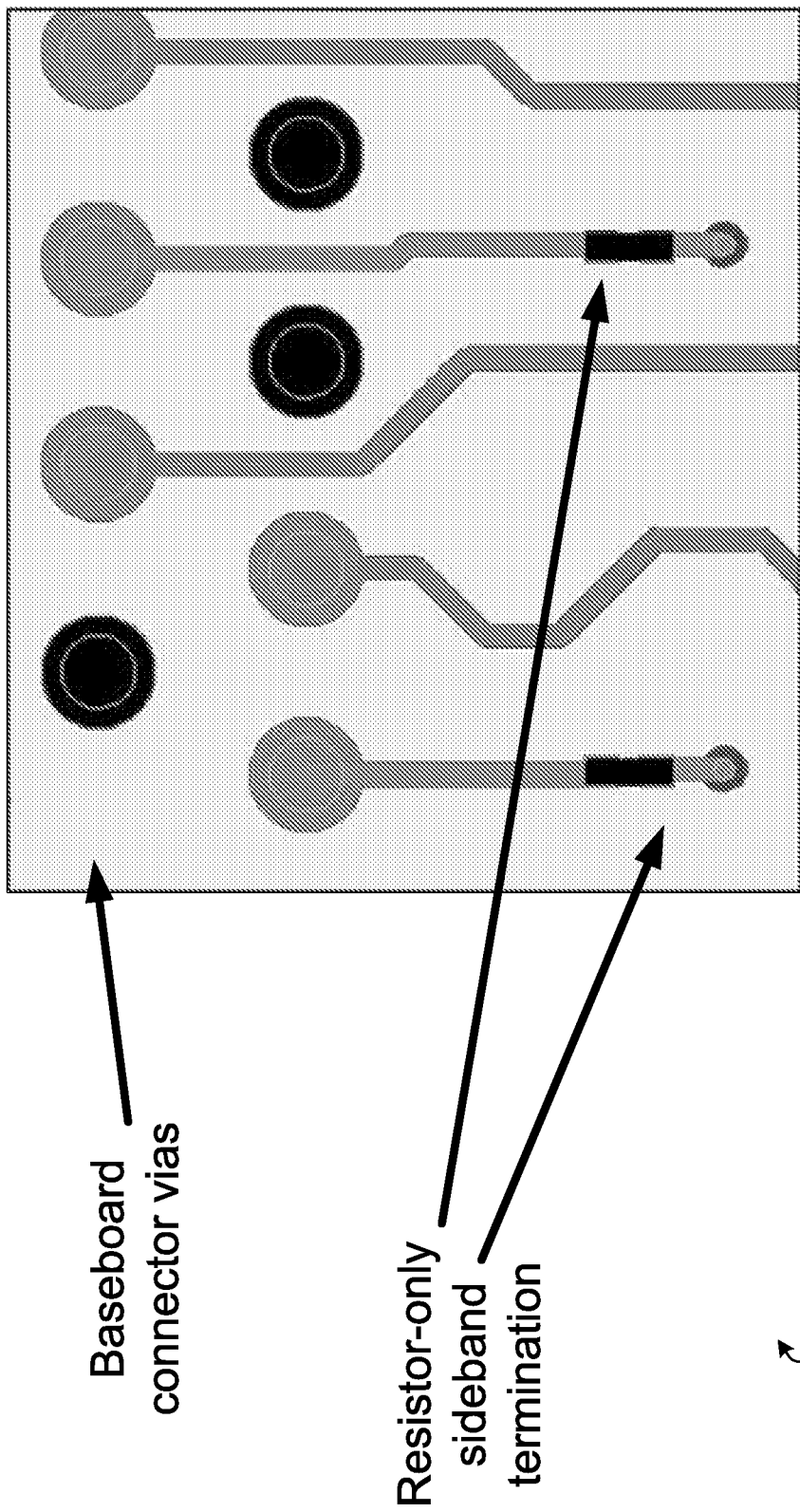
FIG. 11 illustrates a representation of an example connector pinfield including one or more sideband conductors.

A series RC circuit network can prevent low frequency loading that would occur with the resistor alone. For instance, for the add-in card, the termination may be placed adjacent to the gold edge finger region that engages the baseboard connector. There is ample space for placement of a surface mount resistor and capacitor in this region, as the signals fan out to meet the relatively widely spaced edge fingers. For instance, as illustrated in the representation 1000 of a printed circuit board (PCB) diagram shown in FIG. 10, it can be seen that sufficient PCB area exists to add a capacitor to an existing resistive termination network, for a PCIe add-in card. Similarly, for a PCIe baseboard, the termination may be placed adjacent to the pinfield, similar to the termination shown in the example layout illustrated in FIG. 11, among other examples.

In some implementations, such as PCIe Gen4, the sideband signals that would benefit from termination lie in the high speed side of the edge connector, e.g., at pin positions A12/B12 and above. Other sideband pins, such as those assigned to JTAG, in pin positions A1 to A11 and B1 to B11, may not benefit as strongly from the RC termination. In one example, sideband pins that are provided with AC matched termination (e.g., using implementations of the remediation circuitry described herein) may include such PCIe sideband channels as Reserved, Present# (Prsnt), Clock Request, Power Brake, etc. (such as shown in FIG. 8). There were originally seven Reserved pins, but the definition of Power Brake and Clock Request leave five remaining Reserved pins. A reasonable concern would be the forward compatibility of AC termination of the undefined Reserved pins, since their bandwidth requirements may extend into the range where the AC termination provides stronger resistive loading. It has been observed that the insertion loss and crosstalk performance of the sideband signal paths would limit the bandwidth to perhaps 100 MHz, with relatively low edge rates. Based upon this, it can be concluded that an AC termination scheme may not disturb any future, as-yet undefined, sideband signals (e.g., for Reserved pins), among other example considerations and examples.

Figure 12:
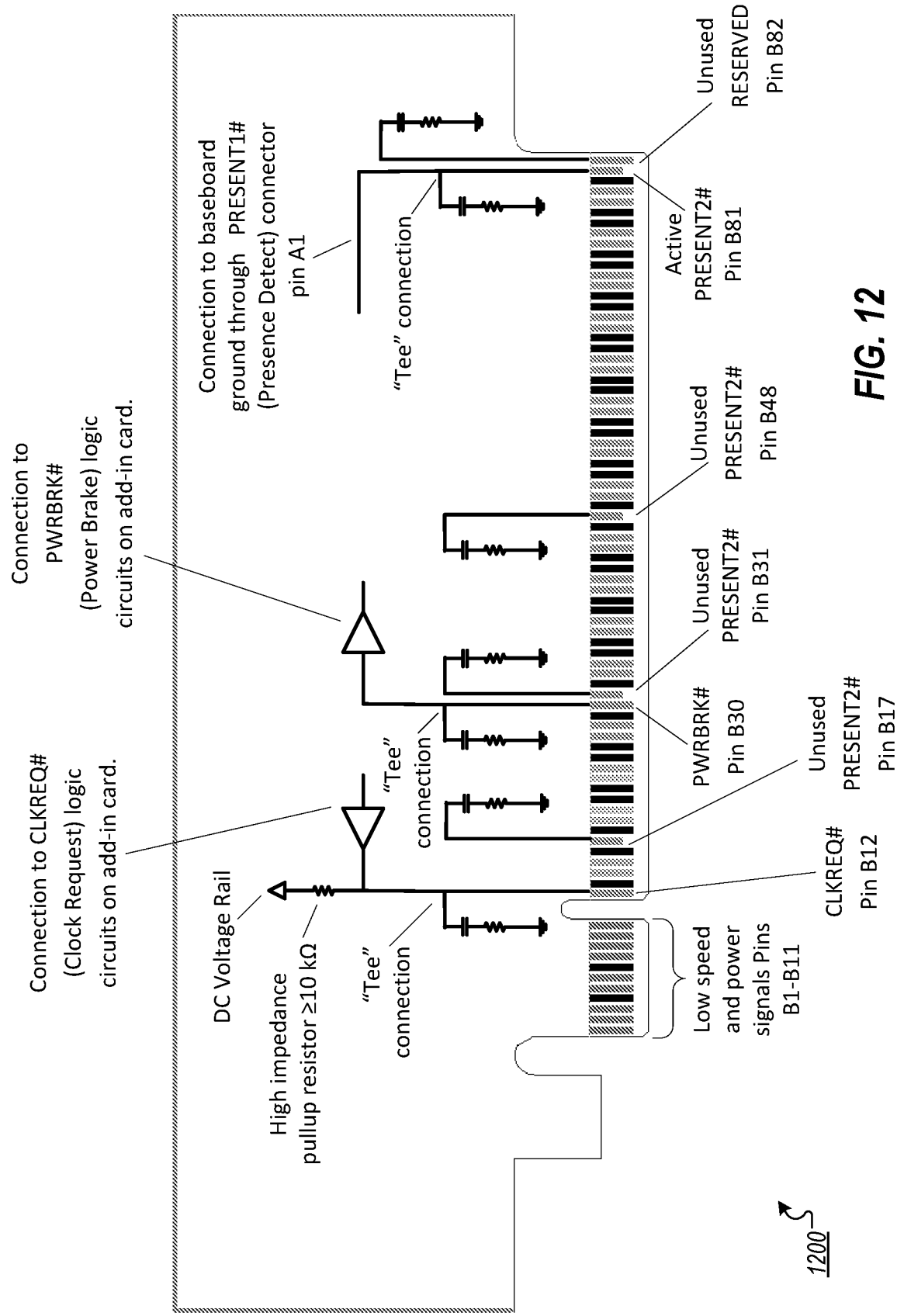
FIG. 12 illustrates a representation of an example circuit board connection scheme including one or more sideband conductors.

Turning to FIG. 12, a simplified block diagram 1200 is shown illustrating an example PCI express ×16 add-in card, depicting the B side of the card only. All sideband signals in this example are shown terminated with AC matched termination. The low speed and power pins B1-B11 are shown without additional AC matched termination (e.g., using implementations of the remediation circuitry described herein). For example, the CLKREQ# (Clock Request) pin is shown connected as a Tee connection, one PRESENT2# pin, B81, is also shown as a Tee connection, as well as the PWRBRK# (Power Brake) pin, B30 (similar to that illustrated in the example of FIG. 7G). The pinfield on the "A" side of the card, comprising pins A1 to A82, are not shown, but it is understood that the A side sideband pins would be terminated in a similar fashion (or using another implementation of remediation circuitry), among other examples.

Note that the apparatus', methods', and systems described above may be implemented in any electronic device or system as aforementioned. As specific illustrations, the figures below provide exemplary systems for utilizing the invention as described herein. As the systems below are described in more detail, a number of different interconnects are disclosed, described, and revisited from the discussion above. And as is readily apparent, the advances described above may be applied to any of those interconnects, fabrics, or architectures.

Figure 13:
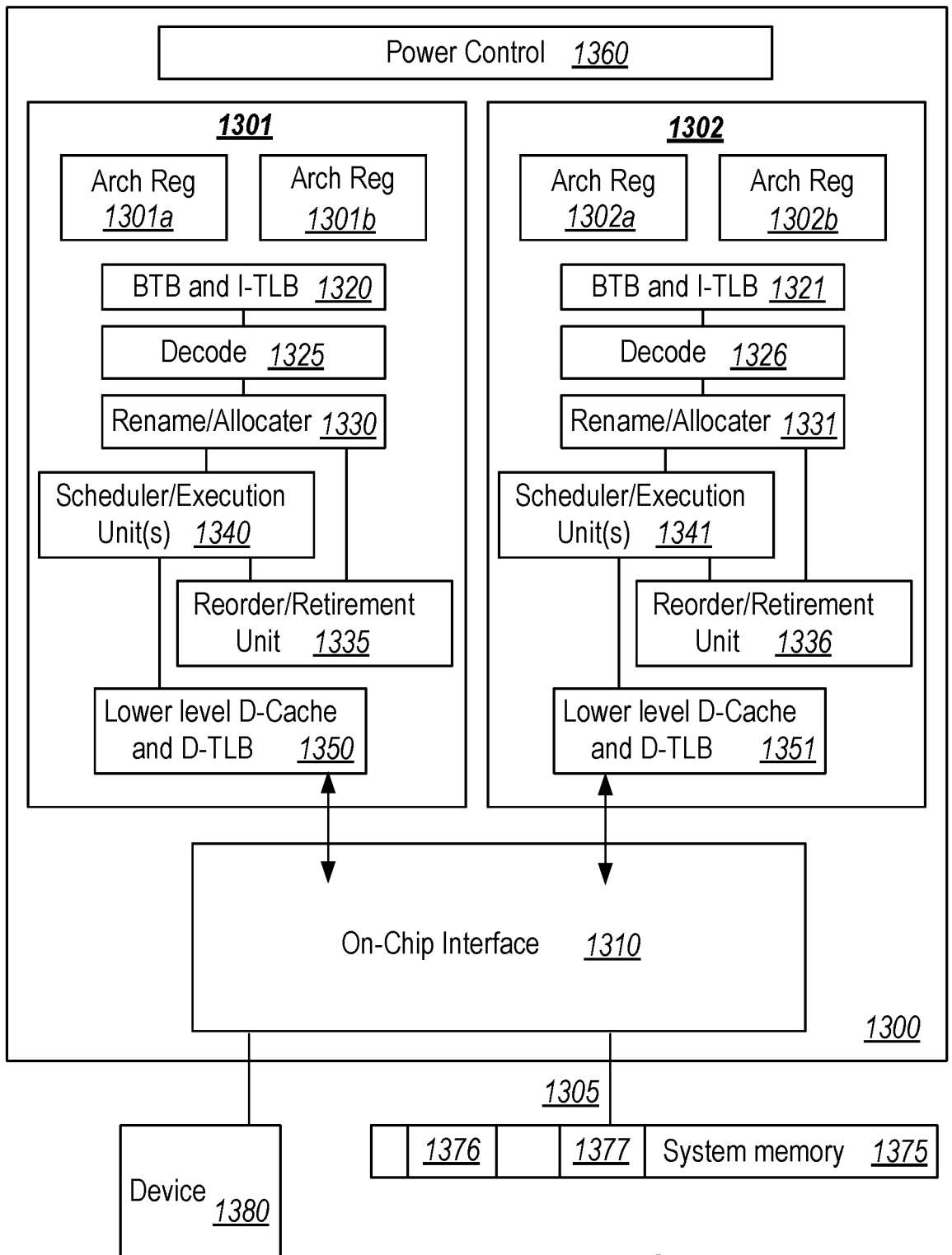
FIG. 13 illustrates an embodiment of a block diagram for a computing system including a multicore processor.

Referring to FIG. 13, an embodiment of a block diagram for a computing system including a multicore processor is depicted. Processor 1300 includes any processor or processing device, such as a microprocessor, an embedded processor, a digital signal processor (DSP), a network processor, a handheld processor, an application processor, a co-processor, a system on a chip (SOC), or other device to execute code. Processor 1300, in one embodiment, includes at least two cores—core 1301 and 1302, which may include asymmetric cores or symmetric cores (the illustrated embodiment). However, processor 1300 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 1300, as illustrated in FIG. 13, includes two cores—core 1301 and 1302. Here, core 1301 and 1302 are considered symmetric cores, i.e. cores with the same configurations, functional units, and/or logic. In another embodiment, core 1301 includes an out-of-order processor core, while core 1302 includes an in-order processor core. However, cores 1301 and 1302 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 1301 are described in further detail below, as the units in core 1302 operate in a similar manner in the depicted embodiment.

As depicted, core 1301 includes two hardware threads 1301*a* and 1301*b*, which may also be referred to as hardware thread slots 1301*a* and 1301*b*. Therefore, software entities, such as an operating system, in one embodiment potentially view processor 1300 as four separate processors, i.e., four logical processors or processing elements capable of executing four software threads concurrently. As alluded to above, a first thread is associated with architecture state registers 1301*a*, a second thread is associated with architecture state registers 1301*b*, a third thread may be associated with architecture state registers 1302*a*, and a fourth thread may be associated with architecture state registers 1302*b*. Here, each of the architecture state registers (1301*a*, 1301*b*, 1302*a*, and 1302*b*) may be referred to as processing elements, thread slots, or thread units, as described above. As illustrated, architecture state registers 1301*a* are replicated in architecture state registers 1301*b*, so individual architecture states/contexts are capable of being stored for logical processor 1301*a* and logical processor 1301*b*. In core 1301, other smaller resources, such as instruction pointers and renaming logic in allocator and renamer block 1330 may also be replicated for threads 1301*a* and 1301*b*. Some resources, such as re-order buffers in reorder/retirement unit 1335, ILTB 1320, load/store buffers, and queues may be shared through partitioning. Other resources, such as general purpose internal registers, page-table base register(s), low-level data-cache and data-TLB 1315, execution unit(s) 1340, and portions of out-of-order unit 1335 are potentially fully shared.

Processor 1300 often includes other resources, which may be fully shared, shared through partitioning, or dedicated by/to processing elements. In FIG. 13, an embodiment of a purely exemplary processor with illustrative logical units/resources of a processor is illustrated. Note that a processor may include, or omit, any of these functional units, as well as include any other known functional units, logic, or firmware not depicted. As illustrated, core 1301 includes a simplified, representative out-of-order (OOO) processor core. But an in-order processor may be utilized in different embodiments. The OOO core includes a branch target buffer 1320 to predict branches to be executed/taken and an instruction-translation buffer (I-TLB) 1320 to store address translation entries for instructions.

Core 1301 further includes decode module 1325 coupled to fetch unit 1320 to decode fetched elements. Fetch logic, in one embodiment, includes individual sequencers associated with thread slots 1301*a*, 1301*b*, respectively. Usually core 1301 is associated with a first ISA, which defines/specifies instructions executable on processor 1300. Often machine code instructions that are part of the first ISA include a portion of the instruction (referred to as an opcode), which references/specifies an instruction or operation to be performed. Decode logic 1325 includes circuitry that recognizes these instructions from their opcodes and passes the decoded instructions on in the pipeline for processing as defined by the first ISA. For example, as discussed in more detail below decoders 1325, in one embodiment, include logic designed or adapted to recognize specific instructions, such as transactional instruction. As a result of the recognition by decoders 1325, the architecture or core 1301 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 1326, in one embodiment, recognize the same ISA (or a subset thereof). Alternatively, in a heterogeneous core environment, decoders 1326 recognize a second ISA (either a subset of the first ISA or a distinct ISA).

In one example, allocator and renamer block 1330 includes an allocator to reserve resources, such as register files to store instruction processing results. However, threads 1301*a* and 1301*b* are potentially capable of out-of-order execution, where allocator and renamer block 1330 also reserves other resources, such as reorder buffers to track instruction results. Unit 1330 may also include a register renamer to rename program/instruction reference registers to other registers internal to processor 1300. Reorder/retirement unit 1335 includes components, such as the reorder buffers mentioned above, load buffers, and store buffers, to support out-of-order execution and later in-order retirement of instructions executed out-of-order.

Scheduler and execution unit(s) block 1340, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 1350 are coupled to execution unit(s) 1340. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 1301 and 1302 share access to higher-level or further-out cache, such as a second level cache associated with on-chip interface 1310. Note that higher-level or further-out refers to cache levels increasing or getting further way from the execution unit(s). In one embodiment, higher-level cache is a last-level data cache—last cache in the memory hierarchy on processor 1300—such as a second or third level data cache. However, higher level cache is not so limited, as it may be associated with or include an instruction cache. A trace cache—a type of instruction cache—instead may be coupled after decoder 1325 to store recently decoded traces. Here, an instruction potentially refers to a macro-instruction (i.e. a general instruction recognized by the decoders), which may decode into a number of micro-instructions (micro-operations).

In the depicted configuration, processor 1300 also includes on-chip interface module 1310. Historically, a memory controller, which is described in more detail below, has been included in a computing system external to processor 1300. In this scenario, on-chip interface 1310 is to communicate with devices external to processor 1300, such as system memory 1375, a chipset (often including a memory controller hub to connect to memory 1375 and an I/O controller hub to connect peripheral devices), a memory controller hub, a northbridge, or other integrated circuit. And in this scenario, bus 1305 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 1375 may be dedicated to processor 1300 or shared with other devices in a system. Common examples of types of memory 1375 include DRAM, SRAM, non-volatile memory (NV memory), and other known storage devices. Note that device 1380 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 1300. For example in one embodiment, a memory controller hub is on the same package and/or die with processor 1300. Here, a portion of the core (an on-core portion) 1310 includes one or more controller(s) for interfacing with other devices such as memory 1375 or a graphics device 1380. The configuration including an interconnect and controllers for interfacing with such devices is often referred to as an on-core (or un-core configuration). As an example, on-chip interface 1310 includes a ring interconnect for on-chip communication and a high-speed serial point-to-point link 1305 for off-chip communication. Yet, in the SOC environment, even more devices, such as the network interface, co-processors, memory 1375, graphics processor 1380, and any other known computer devices/interface may be integrated on a single die or integrated circuit to provide small form factor with high functionality and low power consumption.

In one embodiment, processor 1300 is capable of executing a compiler, optimization, and/or translator code 1377 to compile, translate, and/or optimize application code 1376 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

Figure 14:
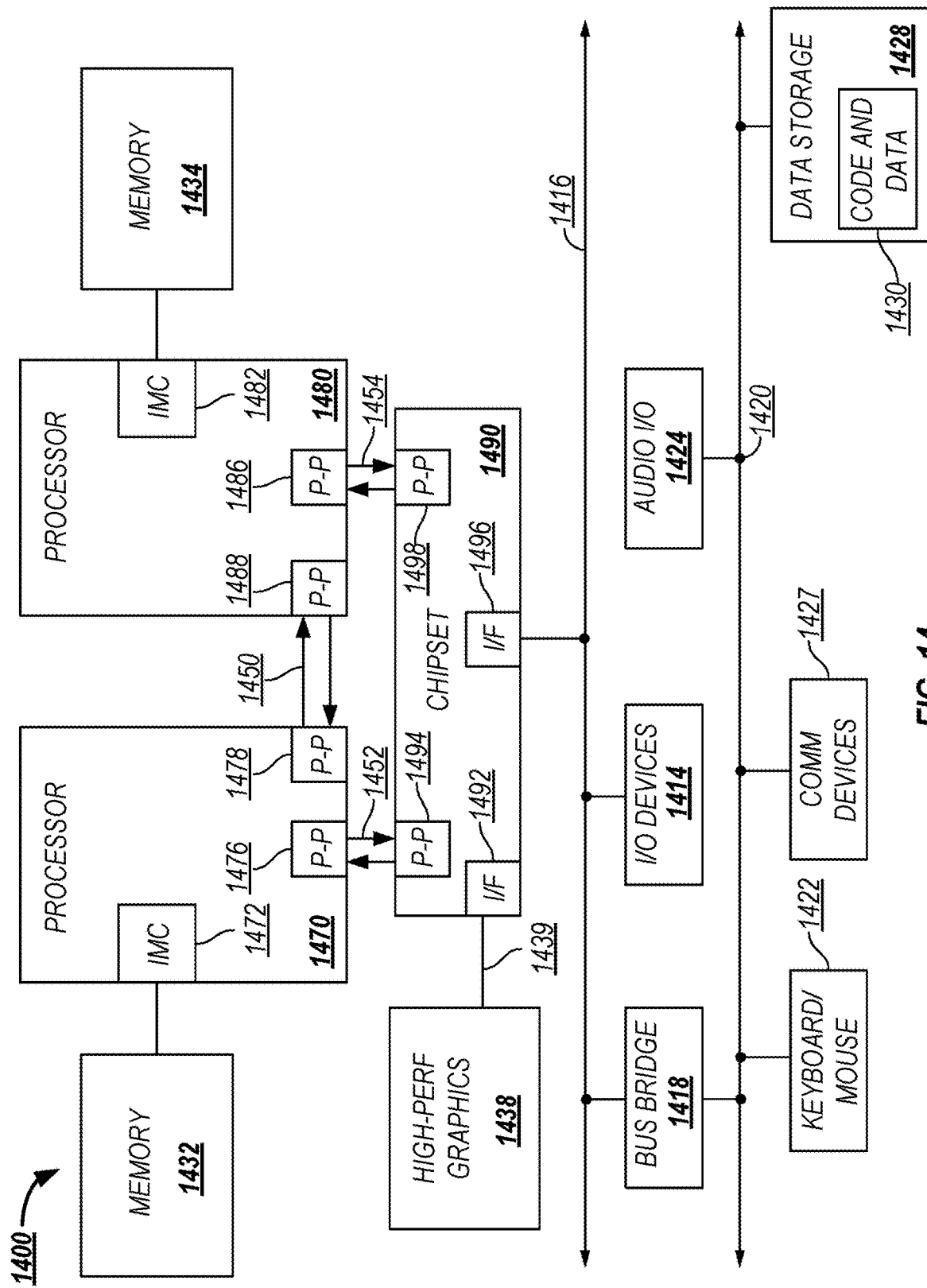
FIG. 14 illustrates another embodiment of a block diagram for a computing system.

Referring now to FIG. 14, shown is a block diagram of a second system 1400 in accordance with an embodiment of the present invention. As shown in FIG. 14, multiprocessor system 1400 is a point-to-point interconnect system, and includes a first processor 1470 and a second processor 1480 coupled via a point-to-point interconnect 1450. Each of processors 1470 and 1480 may be some version of a processor. In one embodiment, 1452 and 1454 are part of a serial, point-to-point coherent interconnect fabric, such as Intel's Quick Path Interconnect (QPI) architecture. As a result, the invention may be implemented within the QPI architecture.

While shown with only two processors 1470, 1480, it is to be understood that the scope of the present invention is not so limited. In other embodiments, one or more additional processors may be present in a given processor.

Processors 1470 and 1480 are shown including integrated memory controller units 1472 and 1482, respectively. Processor 1470 also includes as part of its bus controller units point-to-point (P-P) interfaces 1476 and 1478; similarly, second processor 1480 includes P-P interfaces 1486 and 1488. Processors 1470, 1480 may exchange information via a point-to-point (P-P) interface 1450 using P-P interface circuits 1478, 1488. As shown in FIG. 14, IMCs 1472 and 1482 couple the processors to respective memories, namely a memory 1432 and a memory 1434, which may be portions of main memory locally attached to the respective processors.

Processors 1470, 1480 each exchange information with a chipset 1490 via individual P-P interfaces 1452, 1454 using point to point interface circuits 1476, 1494, 1486, 1498. Chipset 1490 also exchanges information with a high-performance graphics circuit 1438 via an interface circuit 1492 along a high-performance graphics interconnect 1439.

A shared cache (not shown) may be included in either processor or outside of both processors; yet connected with the processors via P-P interconnect, such that either or both processors' local cache information may be stored in the shared cache if a processor is placed into a low power mode.

Chipset 1490 may be coupled to a first bus 1416 via an interface 1496. In one embodiment, first bus 1416 may be a Peripheral Component Interconnect (PCI) bus, or a bus such as a PCI Express bus or another third generation I/O interconnect bus, although the scope of the present invention is not so limited.

As shown in FIG. 14, various I/O devices 1414 are coupled to first bus 1416, along with a bus bridge 1418 which couples first bus 1416 to a second bus 1420. In one embodiment, second bus 1420 includes a low pin count (LPC) bus. Various devices are coupled to second bus 1420 including, for example, a keyboard and/or mouse 1422, communication devices 1427 and a storage unit 1428 such as a disk drive or other mass storage device which often includes instructions/code and data 1430, in one embodiment. Further, an audio I/O 1424 is shown coupled to second bus 1420. Note that other architectures are possible, where the included components and interconnect architectures vary. For example, instead of the point-to-point architecture of FIG. 14, a system may implement a multi-drop bus or other such architecture.

Computing systems can include various combinations of components. These components may be implemented as ICs, portions thereof, discrete electronic devices, or other modules, logic, hardware, software, firmware, or a combination thereof adapted in a computer system, or as components otherwise incorporated within a chassis of the computer system. However, it is to be understood that some of the components shown may be omitted, additional components may be present, and different arrangement of the components shown may occur in other implementations. As a result, the invention described above may be implemented in any portion of one or more of the interconnects illustrated or described herein.

A processor, in one embodiment, includes a microprocessor, multi-core processor, multithreaded processor, an ultra low voltage processor, an embedded processor, or other known processing element. In the illustrated implementation, processor acts as a main processing unit and central hub for communication with many of the various components of the system. As one example, processor is implemented as a system on a chip (SoC). As a specific illustrative example, processor includes an Intel® Architecture Core™-based processor such as an i3, i5, i7 or another such processor available from Intel Corporation, Santa Clara, Calif. However, understand that other low power processors such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor. Note that many of the customer versions of such processors are modified and varied; however, they may support or recognize a specific instructions set that performs defined algorithms as set forth by the processor licensor. Here, the microarchitectural implementation may vary, but the architectural function of the processor is usually consistent. Certain details regarding the architecture and operation of processor in one implementation will be discussed further below to provide an illustrative example.

Processor, in one embodiment, communicates with a system memory. As an illustrative example, which in an embodiment can be implemented via multiple memory devices to provide for a given amount of system memory. As examples, the memory can be in accordance with a Joint Electron Devices Engineering Council (JEDEC) low power double data rate (LPDDR)-based design such as the current LPDDR2 standard according to JEDEC JESD 209-2E (published April 2009), or a next generation LPDDR standard to be referred to as LPDDR3 or LPDDR4 that will offer extensions to LPDDR2 to increase bandwidth. In various implementations the individual memory devices may be of different package types such as single die package (SDP), dual die package (DDP) or quad die package (13P). These devices, in some embodiments, are directly soldered onto a motherboard to provide a lower profile solution, while in other embodiments the devices are configured as one or more memory modules that in turn couple to the motherboard by a given connector. And of course, other memory implementations are possible such as other types of memory modules, e.g., dual inline memory modules (DIMMs) of different varieties including but not limited to microDIMMs, MiniDIMMs. In a particular illustrative embodiment, memory is sized between 2 GB and 16 GB, and may be configured as a DDR3LM package or an LPDDR2 or LPDDR3 memory that is soldered onto a motherboard via a ball grid array (BGA).

To provide for persistent storage of information such as data, applications, one or more operating systems and so forth, a mass storage may also couple to processor. In various embodiments, to enable a thinner and lighter system design as well as to improve system responsiveness, this mass storage may be implemented via a SSD. However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. A flash device may be coupled to processor, e.g., via a serial peripheral interface (SPI). This flash device may provide for non-volatile storage of system software, including a basic input/output software (BIOS) as well as other firmware of the system.

In various embodiments, mass storage of the system is implemented by a SSD alone or as a disk, optical or other drive with an SSD cache. In some embodiments, the mass storage is implemented as a SSD or as a HDD along with a restore (RST) cache module. In various implementations, the HDD provides for storage of between 320 GB-4 terabytes (TB) and upward while the RST cache is implemented with a SSD having a capacity of 24 GB-256 GB. Note that such SSD cache may be configured as a single level cache (SLC) or multi-level cache (MLC) option to provide an appropriate level of responsiveness. In a SSD-only option, the module may be accommodated in various locations such as in a mSATA or NGFF slot. As an example, an SSD has a capacity ranging from 120 GB-1 TB.

While the present invention has been described with respect to a limited number of embodiments, those skilled in the art will appreciate numerous modifications and variations therefrom. It is intended that the appended claims cover all such modifications and variations as fall within the true spirit and scope of this present invention.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present invention.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc, which are to be distinguished from the non-transitory mediums that may receive information there from.

Instructions used to program logic to perform embodiments of the invention may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

The following examples pertain to embodiments in accordance with this Specification. There is disclosed in an example 1, an apparatus comprising: a first pair of conductors to carry differential signals; at least one ground conductor adjacent to the first pair of conductors, the ground conductor to be connected to a ground plane; and at least one particular conductor to carry sideband signals, where the particular conductor is to be connected to a ground plane via a resonance mitigation circuit, and the resonance mitigation circuit comprises a resistor. Layout of the conductors may be according to a Peripheral Component Interconnect (PCI) Express (PCIe)-based specification.

In example 2, the apparatus of example 1 can optionally include the resonance mitigation circuit which further includes a capacitor in series with the resistor.

In example 3, the apparatus of any of examples 1 and 2, may optionally include the resonance mitigation circuit, which further includes a tee-connection, and the resistor and capacitor are in a first of at least two branches of the tee-connection.

In example 4, the resonance mitigation circuit of the apparatus of example 1 can optionally mitigate resonance manifesting in the particular conductor when the particular conductor has at least one floating connection.

In example 5, the floating connection of the apparatus of any of examples 1 and 4 can optionally be one of an open connection and a connection with a mismatched impedance.

In example 6, the differential signals of the apparatus of example 1 can optionally include high speed signals with frequencies higher than frequencies of the sideband signals.

In example 7, the differential signals of the apparatus of any of examples 1 and 6 can optionally include signals with frequencies greater than 100 MHz.

In example 8, the resonance mitigation circuit of the apparatus of any of examples 1, 6, and 7 can optionally damp high frequency resonant energy while allowing operation of the sideband signals.

In example 9, the apparatus of example 1 can optionally include the first pair of conductors, ground conductor, and particular conductor.

In example 10, the connector of the apparatus of any of examples 1 and 9 can optionally include card edge contacts of an add-in card.

In example 11, the add-in card of any of examples 1, 9, and 10 can optionally include an add-in card compliant with a PCIe-based protocol.

In example 12, the connector of the apparatus of any of examples 1 and 9 can optionally include a card edge connector to accept an add-in card.

In example 13, the connector of the apparatus of any of examples 1 and 9 can optionally include the connector comprises card edge contacts of a baseboard card.

In example 14, the baseboard card of any of examples 1, 9, and 13 can optionally include a baseboard card compliant with a PCIe-based protocol.

There is disclosed in example 15, a method that includes sending a differential signal on a pair of conductors of a connector comprising a plurality of conductors, wherein the differential signal radiates energy to another one of the plurality of conductors, damping the energy manifesting on the other conductor from the differential signal using a resonance mitigation circuit, and sending a sideband signal on the other conductor. The other conductor can be coupled to a ground plane via the resonance mitigation circuit, and the resonance mitigation circuit can include a resistor and a capacitor in series. The layout of the plurality of conductors of the connector can be according to a Peripheral Component Interconnect (PCI) Express (PCIe)-based specification.

There is disclosed in example 16, a system including a board comprising a card edge connector and an add-in card connected to the card edge connector. The card edge connector can include a first pair of conductors to carry differential signals, at least one ground conductor adjacent to the first pair of conductors, the ground conductor to be connected to a ground plane, and at least one particular conductor to carry sideband signals, wherein the particular conductor is to be connected to a ground plane via a resonance mitigation circuit, and the resonance mitigation circuit comprises a resistor in series with a capacitor.

In example 17, the add-in card of the system of example 16 can optionally include a pair of conductors to correspond to the first pair of conductors and carry the differential signals, a ground conductor to correspond to the ground conductor of the card edge connector, and a sideband conductor to correspond to the particular conductor.

In example 18, the sideband conductor of the system of any one of examples 16 and 17 can optionally be connected to a ground plane via a respective resonance mitigation circuit, and the respective resonance mitigation circuit can include a resistor in series with a capacitor.

In example 19, the sideband conductor of the system of any one of examples 16, 17, and 18 can optionally be unterminated at the add-in card.

In example 20, the resonance mitigation circuit of the system of example 16 can optionally consist of the resistor connected in series to the capacitor.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   an add-in card comprising a connector, wherein the connector comprises:
   a set of signaling conductors corresponding to differential transmitter pairs and differential receiver pairs of an interface; and
   a set of auxiliary conductors, wherein one of the auxiliary conductors in the set of auxiliary conductors comprises a respective alternating current (AC) match termination, wherein the AC match termination terminates to ground via a resistor in series with a capacitor.

2. The apparatus of claim 1, wherein the interface is based on a Peripheral Component Interconnect Express (PCIe)-based specification.

3. The apparatus of claim 1, wherein one or more of the auxiliary conductors has a tee connection to the corresponding AC match termination.

4. The apparatus of claim 1, wherein the set of signaling conductors are to carry high-speed data signals and the set of auxiliary conductors are to carry auxiliary signals.

5. The apparatus of claim 4, wherein the auxiliary signals comprise one or more of a Reserved signal, a Present# (PRSNT) signal, a Clock Request signal, or a Power Brake signal.

6. The apparatus of claim 5, wherein the auxiliary signals comprise the Reserved signal, the Present# (PRSNT) signal, the Clock Request signal, and the Power Brake signal.

7. The apparatus of claim 4, wherein the high-speed data signals are according to a PCIe-based interconnect protocol.

8. The apparatus of claim 1, wherein the auxiliary conductor in the set of auxiliary conductors is positioned physically adjacent within the connector to at least one of the set of signaling conductors.

9. The apparatus of claim 8, wherein a particular one of the set of auxiliary conductors is physically adjacent to a particular one of the set of signaling conductors and the AC match termination on the particular auxiliary conductor to at least partially eliminate high frequency crosstalk on the particular signaling conductor.

10. The apparatus of claim 1, wherein the AC match termination terminates the auxiliary conductor to ground via the capacitor coupled in series with the resistor.

11. An apparatus comprising:
a system board comprising a connector pinfield, wherein the connector pinfield comprises:
 a set of signaling conductors corresponding differential transmitter pairs and differential receiver pairs of an interface defined based on a Peripheral Component Interconnect Express (PCIe)-based specification; and
 a set of auxiliary conductors, wherein one of the auxiliary conductors in the set of auxiliary conductors comprises a respective alternating current (AC) match termination, wherein the AC match termination comprises a termination via a resistor-capacitor (RC) circuit.

12. The apparatus of claim 11, wherein each of the conductors comprises a respective via and an edge finger contact element.

13. The apparatus of claim 11, wherein the connector pinfield further comprises a set of ground conductors.

14. A system comprising:
a connector;
a first device; and
a second device connected to the first device by the connector to interoperate with the first device, wherein the connector comprises:
 a set of signaling conductors corresponding to differential transmitter pairs and differential receiver pairs of an interface, wherein the second device is to send and receive differential data signals with the first device via the set of signaling conductors; and
 a set of auxiliary conductors, wherein one of the auxiliary conductors in the set of auxiliary conductors comprises a respective alternating current (AC) match termination, wherein the second device is to send and receive auxiliary signals with the first device via the set of auxiliary conductors, and the AC match termination comprises a resistor in series with a capacitor.

15. The system of claim 14, wherein the interface is compliant with a Peripheral Component Interconnect Express (PCIe)-based specification.

16. The system of claim 14, wherein the second device comprises the connector and the first device comprises conductors to mate with the connector.

17. The system of claim 16, wherein the conductors of the first device comprise a first set of conductors corresponding to the set of signaling conductors, a second set of conductors corresponding to the set of ground conductors, and a third set of conductors corresponding to the set of auxiliary conductors.

18. The system of claim 14, wherein the third set of conductors are terminated at the first device through respective AC match terminations.

19. The system of claim 18, wherein the AC match terminations on the first device comprise respective resistances in series with respective capacitances.

20. The system of claim 14, wherein the first device comprises an add-in card.

21. The system of claim 20, wherein the second device comprises a personal computer.

22. The system of claim 14, comprising a server, and the first and second devices comprise components of the server.

23. The system of claim 14, wherein the second device comprises a core-based processor.

* * * * *